(12) United States Patent
Gupta et al.

(10) Patent No.: US 12,243,849 B2
(45) Date of Patent: Mar. 4, 2025

(54) PASSIVES TO FACILITATE MOLD COMPOUND FLOW

(71) Applicant: TEXAS INSTRUMENTS INCORPORATED, Dallas, TX (US)

(72) Inventors: Chittranjan Mohan Gupta, Richardson, TX (US); Yiqi Tang, Allen, TX (US); Rajen Manicon Murugan, Dallas, TX (US); Jie Chen, Plano, TX (US); Tianyi Luo, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 337 days.

(21) Appl. No.: 17/491,378

(22) Filed: Sep. 30, 2021

(65) Prior Publication Data
US 2023/0101847 A1   Mar. 30, 2023

(51) Int. Cl.
| | |
|---|---|
| H01L 25/065 | (2023.01) |
| H01L 21/56 | (2006.01) |
| H01L 23/00 | (2006.01) |
| H01L 23/31 | (2006.01) |
| H01L 23/498 | (2006.01) |
| H01L 25/00 | (2006.01) |

(52) U.S. Cl.
CPC ........ *H01L 25/0655* (2013.01); *H01L 21/565* (2013.01); *H01L 23/3121* (2013.01); *H01L 23/49816* (2013.01); *H01L 24/32* (2013.01); *H01L 24/48* (2013.01); *H01L 24/73* (2013.01); *H01L 24/83* (2013.01); *H01L 24/85* (2013.01); *H01L 25/50* (2013.01); *H01L 2224/32225* (2013.01); *H01L 2224/48157* (2013.01); *H01L 2224/73265* (2013.01); *H01L 2924/19041* (2013.01)

(58) Field of Classification Search
CPC ... H01L 25/0655; H01L 25/50; H01L 21/565; H01L 23/3121; H01L 23/49816; H01L 24/32; H01L 24/48; H01L 24/73; H01L 24/83; H01L 24/85; H10B 80/00
USPC .......................................... 257/723, 724, 924
See application file for complete search history.

(56) References Cited

U.S. PATENT DOCUMENTS

| | | | |
|---|---|---|---|
| 5,982,038 A * | 11/1999 | Toy .................... | H01L 23/10 257/772 |
| 2007/0045829 A1* | 3/2007 | Jeong ................. | H01L 23/552 257/E23.125 |
| 2008/0180919 A1* | 7/2008 | Lim .................... | H05K 3/284 361/728 |

* cited by examiner

*Primary Examiner* — Jasmine J Clark
(74) *Attorney, Agent, or Firm* — Dawn Jos; Frank D. Cimino

(57) ABSTRACT

In examples, a semiconductor package comprises a substrate and multiple columns of semiconductor dies positioned approximately in parallel along a length of the substrate. The package also includes multiple passive components positioned between the multiple columns of semiconductor dies, the multiple passive components angled between 30 and 60 degrees relative to the length of the substrate, a pair of the multiple passive components having a gap therebetween that is configured to permit mold compound flow through capillary action. The package also includes a mold compound covering the substrate, the multiple columns of semiconductor dies, and the multiple passive components.

18 Claims, 24 Drawing Sheets

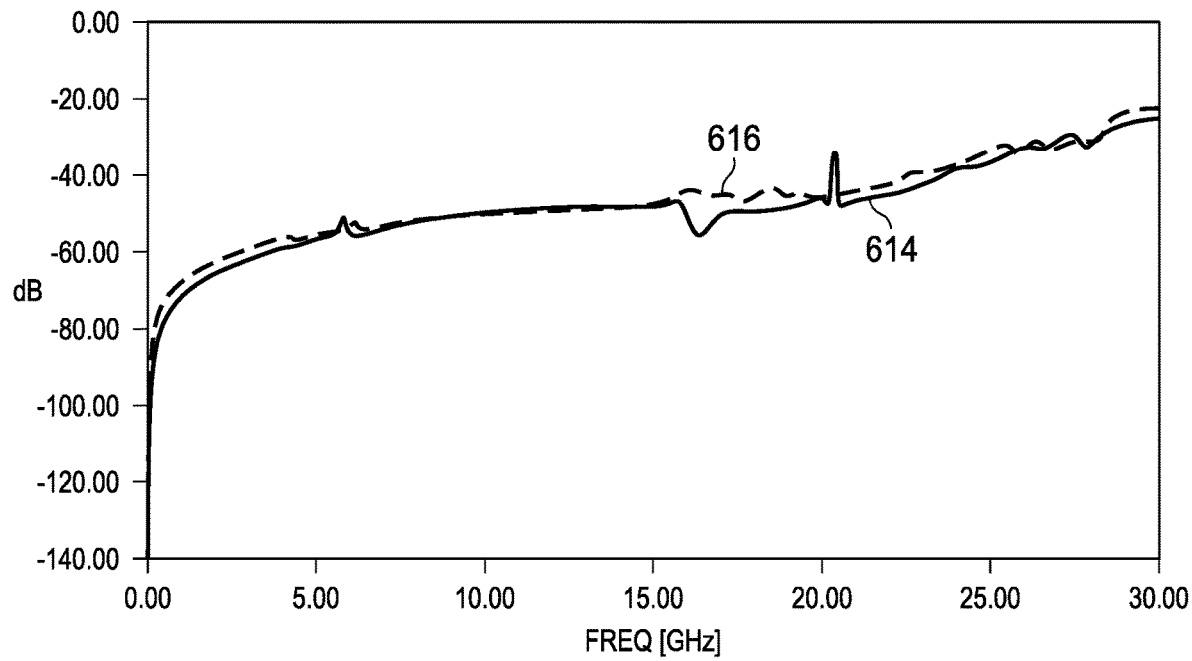

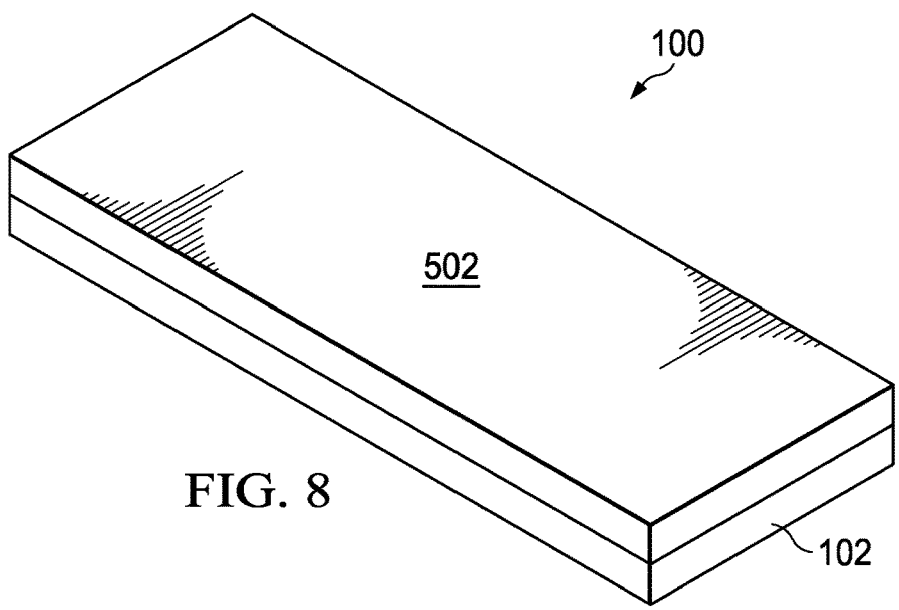
FIG. 8
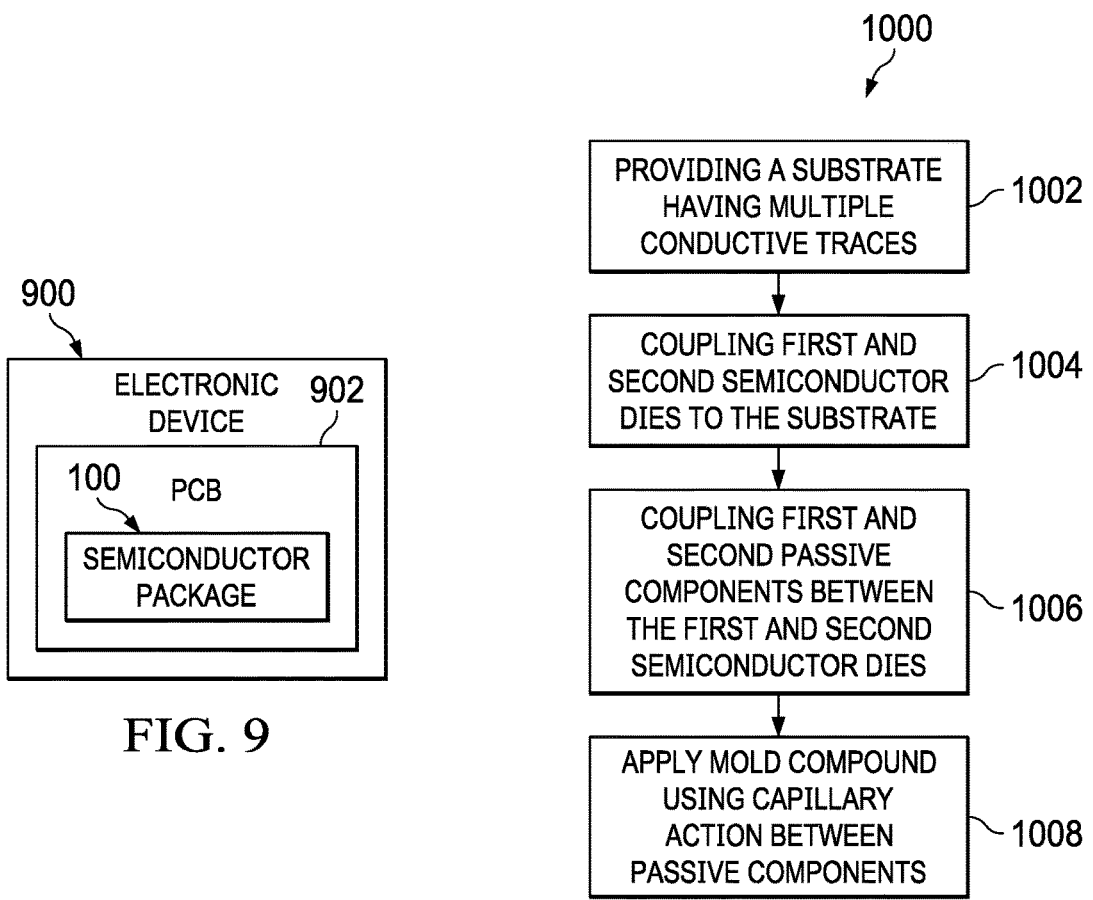
FIG. 9
FIG. 10

PASSIVES TO FACILITATE MOLD COMPOUND FLOW

BACKGROUND

Semiconductor chips are often housed inside semiconductor packages that protect the chips from deleterious environmental influences, such as heat, moisture, and debris. A packaged chip communicates with electronic devices outside the package via conductive members, such as leads, that are exposed to surfaces of the package. Within the package, the chip may be electrically coupled to the conductive members using any suitable technique. One such technique is the flip-chip technique, in which the semiconductor chip (also called a "die") is flipped so the device side of the chip (in which circuitry is formed) is facing downward. The device side is coupled to the conductive members using, e.g., solder bumps. Another technique is the wire-bonding technique, in which the device side of the semiconductor chip is oriented upward and is coupled to the conductive members using bond wires.

SUMMARY

In examples, a semiconductor package comprises a substrate and multiple columns of semiconductor dies positioned approximately in parallel along a length of the substrate. The package also includes multiple passive components positioned between the multiple columns of semiconductor dies, the multiple passive components angled between 30 and 60 degrees relative to the length of the substrate, a pair of the multiple passive components having a gap therebetween that is configured to permit mold compound flow through capillary action. The package also includes a mold compound covering the substrate, the multiple columns of semiconductor dies, and the multiple passive components.

In examples, a method comprises providing a substrate having a first conductive trace coupled to a first conductive terminal of a ball grid array and a second conductive trace coupled to a second conductive terminal of the ball grid array, the first and second conductive traces having no point of overlap in a vertical axis. The method also includes coupling first and second semiconductor dies to a top surface of the substrate. The method also includes coupling a first passive component to the top surface of the substrate between the first and second semiconductor dies, the first passive component having a first terminal coupled to the first semiconductor die and a second terminal coupled to the first conductive trace. The method also includes coupling a second passive component to the top surface of the substrate between the first and second semiconductor dies, the second passive component having a first terminal coupled to the second semiconductor die and a second terminal coupled to the second conductive trace. The method further comprises covering the substrate, the first and second semiconductor dies, and the first and second passive components with a mold compound, the first and second passive components having a gap therebetween that is dimensioned to enable the mold compound to flow through the gap using capillary action.

BRIEF DESCRIPTION OF THE DRAWINGS

For a detailed description of various examples, reference will now be made to the accompanying drawings in which:

FIGS. 6A-6C are graphs depicting the electrical performance of semiconductor packages having passive components to facilitate mold compound flow, in accordance with various examples.

FIG. 8 is a perspective view of a semiconductor package having passive components to facilitate mold compound flow, in accordance with various examples.

FIG. 9 is a block diagram of an electronic device containing a semiconductor package having passive components to facilitate mold compound flow, in accordance with various examples.

FIG. 10 is a flow diagram of a method for manufacturing a semiconductor package having passive components to facilitate mold compound flow, in accordance with various examples.

DETAILED DESCRIPTION

Figure 1A:
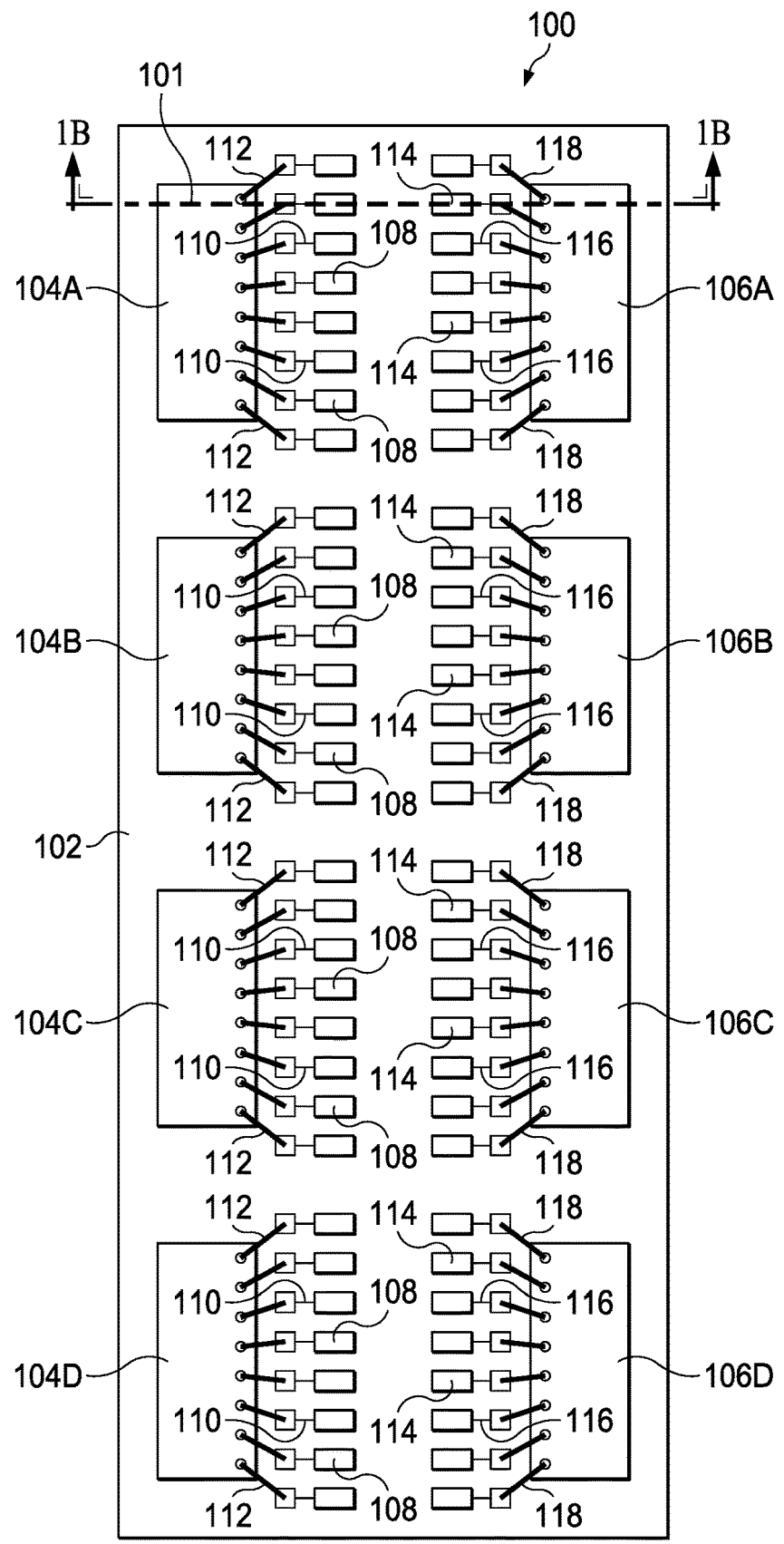
FIGS. 1A, 2A, and 3A are top-down views of portions of semiconductor packages having passive components to facilitate mold compound flow, in accordance with various examples.

Some semiconductor packages include a substrate having multiple conductive traces and vias embedded within the substrate. Semiconductor dies are coupled to a top surface of the substrate, and, by way of the network of conductive traces and vias within the substrate, the dies are coupled to conductive terminals on a bottom surface of the substrate, such as a ball grid array. In addition to semiconductor dies, other components, such as passive components (e.g., capacitors, inductors, resistors), may also be positioned on the top surface of the substrate.

Semiconductor packages may include multiple semiconductor dies and multiple passive components. Many semiconductor packages include multiple columns of semiconductor dies and multiple columns of passive components. Each column of passive components is positioned between a different column of semiconductor dies and a different edge of the top surface of the substrate. When a mold compound is applied to the substrate, semiconductor dies, and passive components, the empty space between the columns of semiconductor dies tends to generate voids (e.g., pockets of air) in the mold compound when the mold compound is applied. The voids are generated due to the dynamics of mold compound flow. The voids are undesirable because they compromise the mechanical and functional integrity and long-term reliability of the package.

This disclosure describes various examples of a semiconductor package having a structure that mitigates the presence of and the deleterious consequences associated with mold compound voids without compromising electrical performance. The semiconductor package includes a substrate having multiple conductive traces and vias embedded therein. First and second columns of semiconductor dies are coupled to a top surface of the substrate, and multiple passive components are positioned in between the first and second columns of semiconductor dies on the top surface of the substrate. Like the semiconductor dies, the passive components are coupled to conductive terminals of a ball grid array on a bottom surface of the substrate, for example, through the network of conductive traces and vias embedded within the various layers of the substrate. The passive components are angled and positioned in a manner relative to the substrate and relative to each other so as to encourage mold compound flow through capillary action and to discourage the formation of mold compound voids. The passive components may be coupled to the semiconductor dies on the top surface of the substrate and to conductive terminals in the ball grid array on the bottom surface of the substrate through the network of conductive traces and vias in the substrate. In some examples, electrical performance is preserved by coupling the conductive terminals to their respective semiconductor dies and conductive terminals using a shortest path available while simultaneously avoiding overlap in any vertical axis between conductive traces coupled to the various passive components, thereby mitigating electrical interference.

Figure 2A:
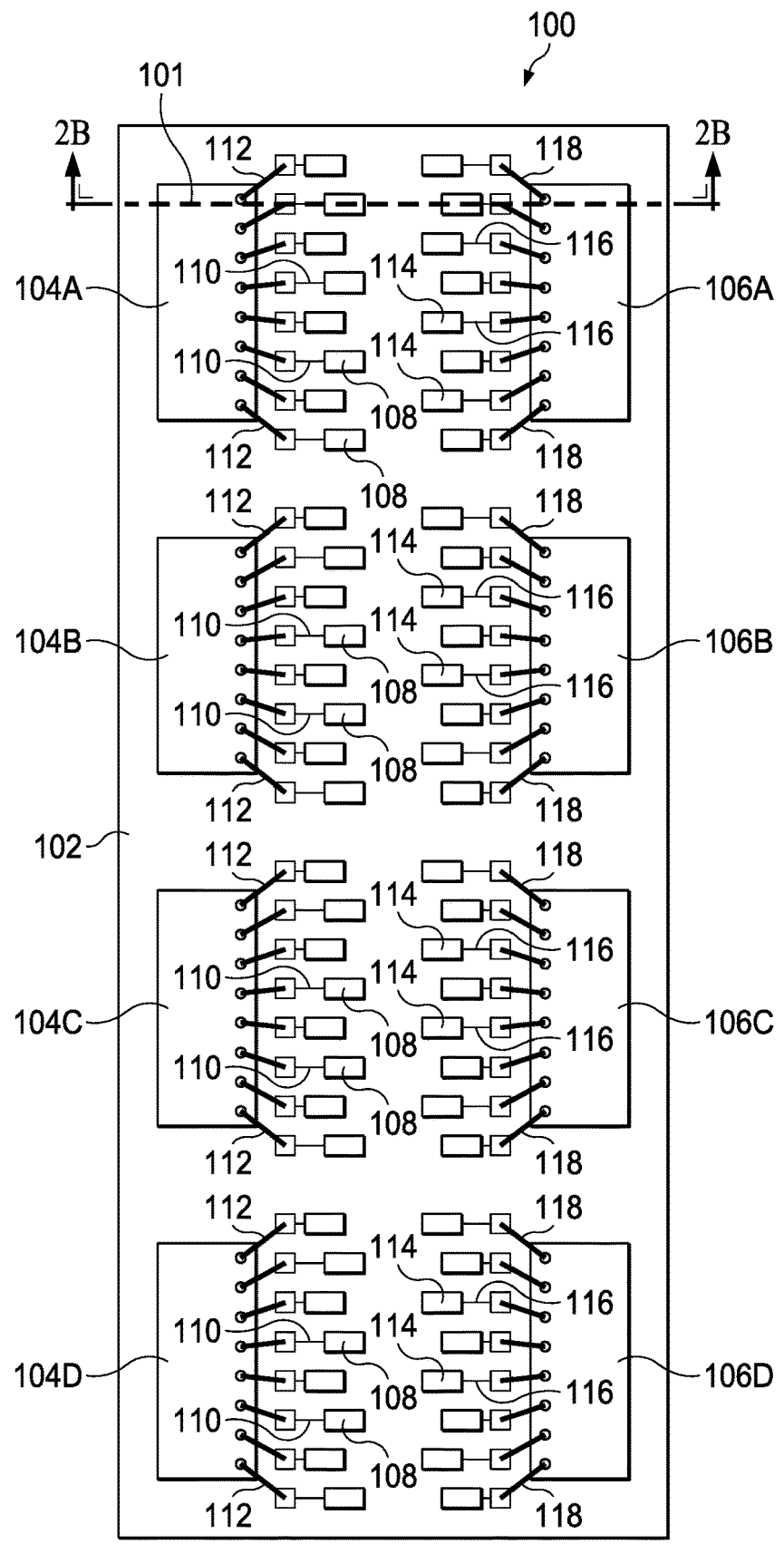
Figure 3A:
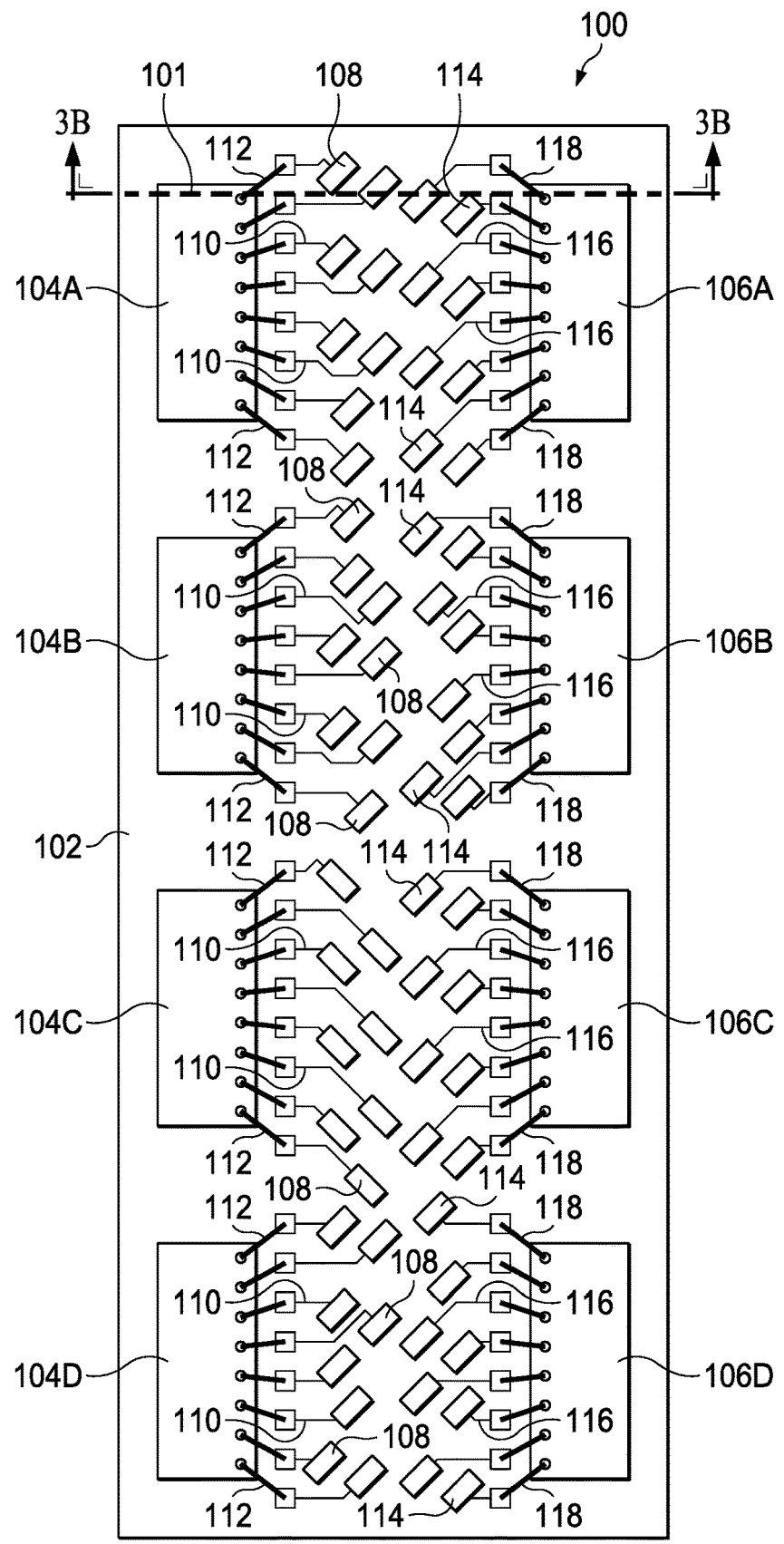

FIGS. 1A, 2A, and 3A are top-down views of portions of semiconductor packages having passive components to facilitate mold compound flow, in accordance with various examples. In particular, FIG. 1A is a top-down view of a substrate 102 of a semiconductor package 100, in accordance with examples. The substrate 102 may include multiple layers and a network of conductive traces distributed throughout the multiple layers, with the layers interconnected through multiple vias. A bottom surface of the substrate 102, which is opposite the top surface of the substrate 102 that is visible in FIG. 1A, may be coupled to conductive terminals, such as a ball grid array (BGA). The substrate 102 has coupled thereto a plurality of semiconductor dies, such as semiconductor dies 104A-104D and 106A-106D. In the examples represented by FIG. 1A, the substrate 102 has coupled thereto four semiconductor dies 104A-104D and four semiconductor dies 106A-106D, for a total of eight semiconductor dies. In other examples, the semiconductor package 100 includes a different number of semiconductor dies. In examples, the semiconductor dies of the semiconductor package 100 are arranged in multiple columns. For instance, as shown in FIG. 1A, the substrate 102 has coupled thereto two columns of semiconductor dies: a first column of semiconductor dies 104A-104D, and a second column of semiconductor dies 106A-106D. In examples, the columns of semiconductor dies 104A-104D and 106A-106D are positioned in parallel along a length of the substrate 102, and, in some examples, are positioned on opposing ends of the substrate 102, as FIG. 1A shows. The semiconductor package 100 also includes multiple passive components 108, 114, such as capacitors, inductors, resistors, or a combination thereof positioned on the substrate 102. In examples, the passive components 108, 114 are positioned between the columns of semiconductor dies 104A-104D, 106A-106D. For example, as FIG. 1A shows, eight passive components 108 are coupled to a device side of the semiconductor die 104A (e.g., a side of the semiconductor die 104A in which circuitry is formed) by way of respective conductive traces 110 and respective bond wires 112. The bond wires 112 may couple to bond pads on the device side of the semiconductor die 104A, although the bond pads are not expressly depicted in FIG. 1A. The bond wires 112 may couple to the conductive traces 110 (or to bond pads that may be considered part of the conductive traces 110) by way of stitch bonds, for example. Similar connections are provided between the remaining passive components 108 and the respective semiconductor dies 104B, 104C, and 104D.

Similar to the coupling between the passive components 108 and the semiconductor dies 104A-104D, the substrate 102 has coupled thereto the passive components 114 and semiconductor dies 106A-106D coupled to the passive components 114. In particular, eight passive components 114 are coupled to respective semiconductor dies 106A-106D by way of conductive traces 116 and bond wires 118 that couple to device sides of the semiconductor dies 106A-106D. Balls, stitch bonds, and/or other similar techniques may be used to establish such connections.

Although the examples of FIG. 1A include eight passive components 108 coupled to each semiconductor die 104A-104D and eight passive components 114 coupled to each semiconductor die 106A-106D, the scope of this disclosure is not limited to any specific number of passive components, any specific number of semiconductor dies, any particular configuration or arrangements of the passive components and/or the semiconductor dies, or any particular manner of coupling the passive components and semiconductor dies.

Figure 1B:
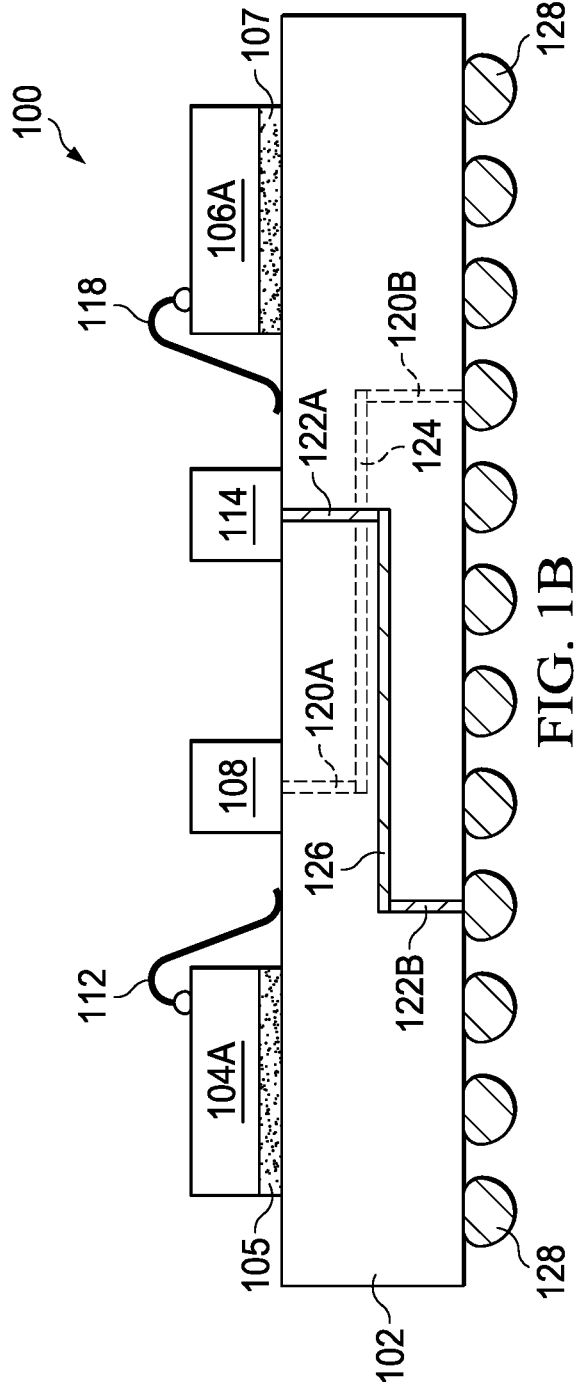
FIGS. 1B, 2B, and 3B are profile cross-sectional views of portions of semiconductor packages having passive components to facilitate mold compound flow, in accordance with various examples.

FIG. 1B is a profile cross-sectional view of portions of the semiconductor package 100, in accordance with various examples. The cross-section of FIG. 1B is taken along the dashed line 101 in FIG. 1A. The semiconductor die 104A is coupled to the top surface of the substrate 102 by way of a die attach layer 105, and the semiconductor die 106A is coupled to the top surface of the substrate 102 by way of a die attach layer 107. The substrate 102 includes a network of conductive traces and vias, although FIG. 1B only shows a portion of such conductive traces and vias. More specifically, FIG. 1B shows the substrate 102 including a via 120A coupled to a terminal of the passive component 108, a conductive trace 124 coupled to the via 120A, and a via 120B coupled to the conductive trace 124. The via 120B may be coupled to a conductive terminal 128, such as a ball of a BGA. Similarly, the substrate 102 includes a via 122A coupled to a terminal of the passive component 114, a conductive trace 126 coupled to the via 122A, and a via 122B coupled to the conductive trace 126. The via 122B may be coupled to another conductive terminal 128, such as a ball of a BGA. In examples, the conductive traces 124, 126 are not in vertical alignment with each other. Stated another way, no portion of the conductive trace 124 shares a vertical axis with any portion of conductive trace 126. Stated yet another way, no vertical axis extends through both the conductive traces 124, 126.

In the event that passive components 108, 114 are capacitors, each such capacitor may include two vertical conductive plates. Each plate may be supported by a separate capacitor pad that abuts the top surface of the substrate 102. The capacitor pads act as terminals that enable the plates to couple to circuitry within the substrate 102. A vertical dielectric may extend from the top surface of the substrate 102 to the top surfaces of the capacitor plates, meaning that the vertical dielectric would be between the capacitor pads and between the capacitor plates. These features are not expressly shown in FIG. 1B because the passive components 108, 114 are not specifically limited to capacitors.

Figure 1C:
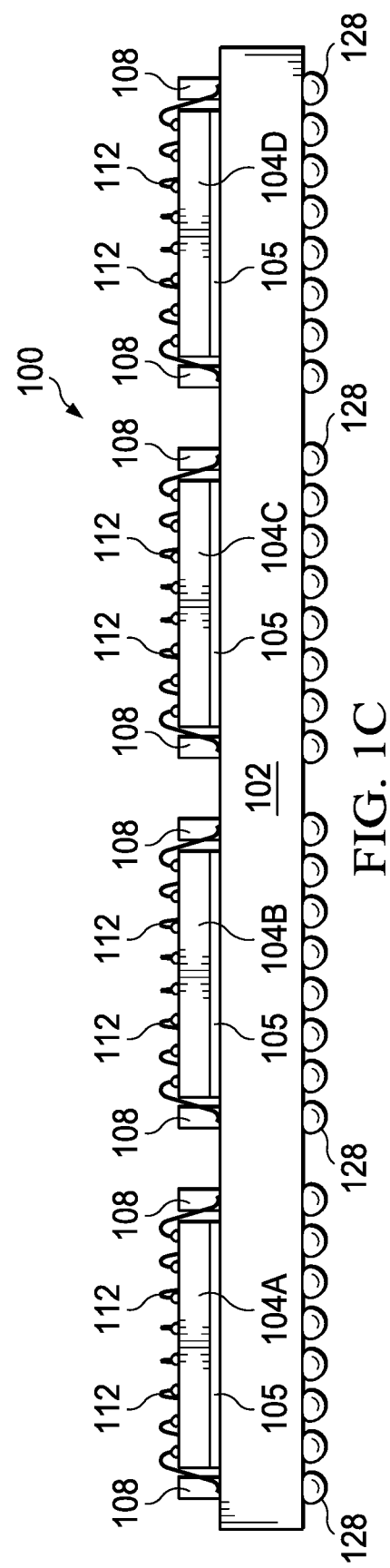
FIGS. 1C, 2C, and 3C are profile cross-sectional views of portions of semiconductor packages having passive components to facilitate mold compound flow, in accordance with various examples.
Figure 1D:
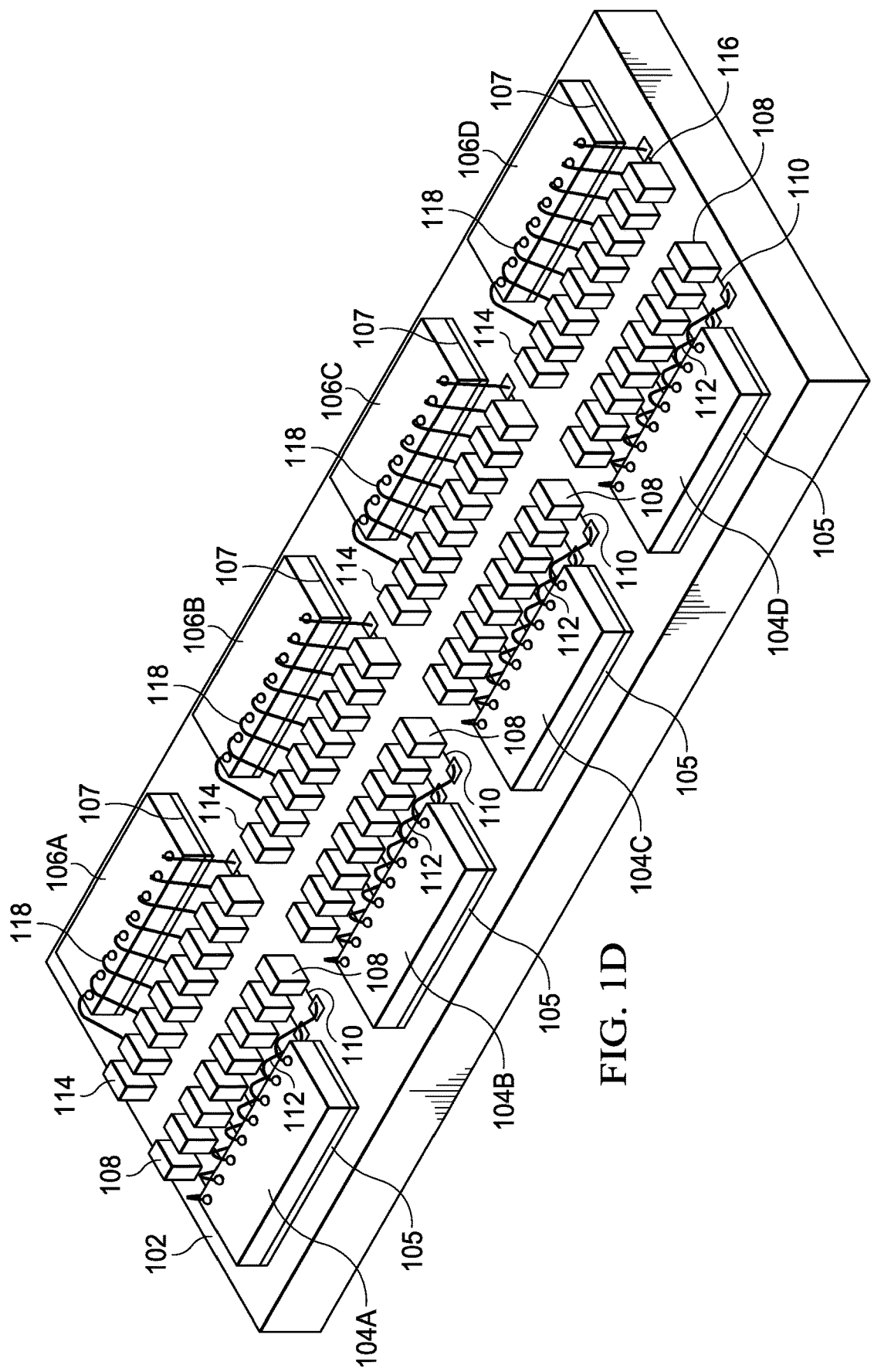
FIGS. 1D, 2D, and 3D are perspective views of portions of semiconductor packages having passive components to facilitate mold compound flow, in accordance with various examples.

FIG. 1C is another profile view of the semiconductor package 100 in accordance with various examples, and FIG. 1D is a perspective view of the semiconductor package 100 in accordance with various examples.

Figure 7A:
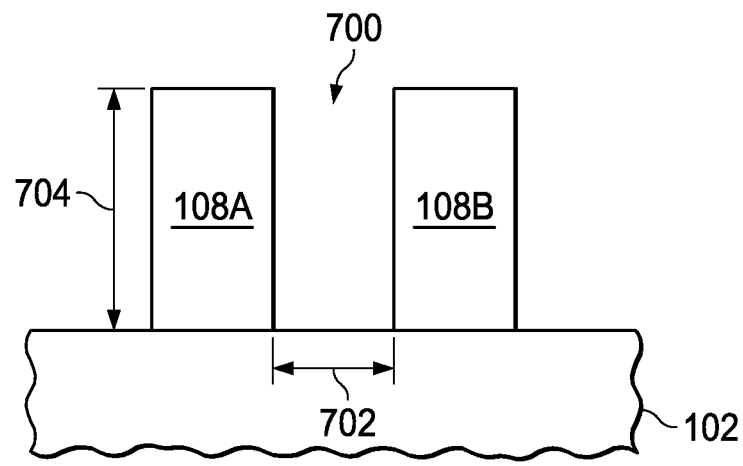
FIGS. 7A-7F are profile cross-sectional and top-down views of pairs of passive components forming a capillary therebetween to facilitate mold compound flow, in accordance with various examples.
Figure 7B:
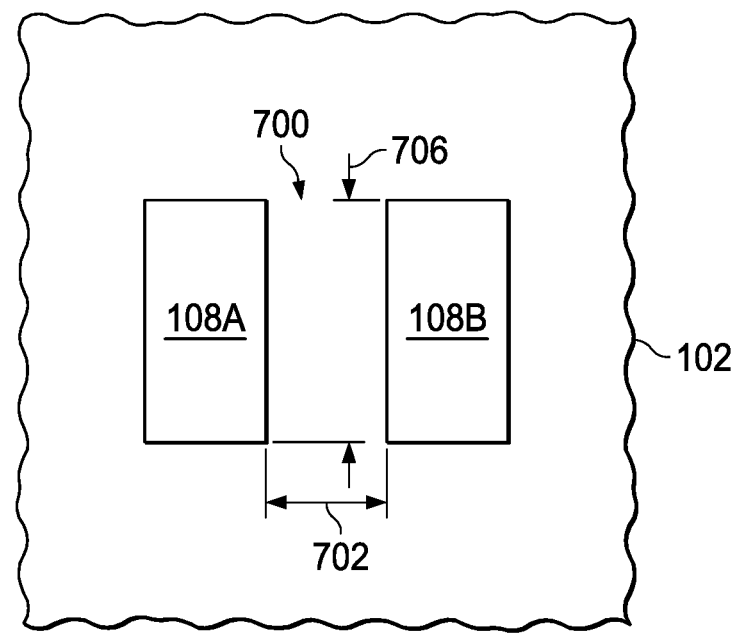

The placement of the passive components 108, 114 on the top surface of the substrate 102 between the columns of semiconductor dies 104A-104D and 106A-106D promotes proper mold compound flow during a mold compound application and mitigates the formation of voids in the mold compound. In some examples, the passive components 108, 114 are arranged in such a way with respect to each other that they form capillaries that use capillary action to promote the flow of mold compound. For example, a gap between a pair of passive components 108 and/or a pair of passive components 114 may have parameters that promote capillary action, e.g., the movement of fluid such as mold compound due to surface tension introduced by the dimensions of a structure. Example dimensions of such capillaries are provided with reference to FIGS. 7A and 7B. FIG. 7A is a profile cross-sectional view of a pair of example passive components 108, referred to for the purposes of this example as passive components 108A and 108B. A gap 700 exists between the passive components 108A, 108B. The gap 700 is a capillary that uses surface tension of a mold compound to promote mold compound flow through capillary action. The gap 700 has a width 702 ranging from 100 microns to 500 microns, with a width above this range being disadvantageous because it is too large to promote capillarity (capillary action), and with a width below this range being disadvantageous because it violates component-to-component spacing design rules required for manufacturability. In case the passive components 108A, 108B are capacitors, the gap 700 has a height 704 ranging from 850 microns to 900 microns, with a height above this range being disadvantageous because it will fail to meet the capacitor value specification, and with a height below this range being disadvantageous for the same reason. FIG. 7B is a top-down view of the pair of passive components 108A, 108B. The gap 700 has a length 706 that ranges from 1500 microns to 1700 microns, with a length above this range being disadvantageous because the passive components 108A, 108B may not be properly positioned on their supports (e.g., a capacitor would not fit properly on its capacitor pads, leading to an open circuit), and with a length below this range being disadvantageous for the same reason. The gap 700 has a cross-sectional area ranging from 0.075 $mm^2$ to 0.09 $mm^2$, with cross-sectional areas below this range being disadvantageous because they would violate component-to-component spacing rules required for manufacturability and with cross-sectional areas above this range being disadvantageous because there would not be adequate space available in the package for die and passive component placement and routing of conductive traces. In case the passive components 108A, 108B are capacitors, the gap 700 has a volume ranging from 1 $mm^3$ to 1.5 $mm^3$, with volumes below this range being disadvantageous because they would fail to meet capacitor value specifications, and with volumes above this range being disadvantageous because they would interfere with mold compound flow. Thus gap 700 promotes mold compound flow and mitigates void formation through capillarity.

Positioning the passive components 108, 114 between the columns of semiconductor dies 104A-104D and 106A-106D promotes proper mold compound flow, but it would necessitate the rearrangement of the semiconductor dies 104A-104D, 106A-106D on the substrate 102 and/or the pinout scheme for the conductive terminals 128, as the pins of the semiconductor dies 104A-104D, 106A-106D and the conductive terminals 128 have specific functionalities associated therewith, and positioning the passive components 108, 114 in between the columns of semiconductor dies 104A-104D and 106A-106D unacceptably interferes with the network of connections that enable those functionalities. An element of this disclosure that facilitates the positioning of the passive components 108, 114 in between the columns of semiconductor dies 104A-104D, 106A-106D is the implementation of the conductive trace network shown in the substrate 102 of FIG. 1B, such that the semiconductor dies 104A-104D, 106A-106D can be oriented as desired to accommodate the positioning of the passive components 108, 114 between the columns of semiconductor dies 104A-104D, 106A-106D without changing the pin scheme of the semiconductor dies 104A-104D, 106A-106D or the pinout scheme of the conductive terminals 128. Stated another way, the structure of the conductive traces 124, 126 as shown in FIG. 1B enables the passive components 108, 114 to be positioned on the top surface of the substrate 102 between the columns of semiconductor dies 104A-104D, 106A-106D without requiring a change in the pinout of the conductive terminals 128 and without requiring a change in the pins of the semiconductor dies 104A-104D, 106A-106D relative to what they would be had the passive components 108, 114 been positioned between a column of semiconductor dies and an edge of the substrate 102 (e.g., along a perimeter of the substrate 102). As described above, the conductive traces 124, 126, although in different layers of the substrate 102, are not at any point in vertical alignment with each other, thereby mitigating the risk of electrical interference. In examples, the conductive traces have widths of approximately 35 microns with a 45 micron gap between the traces.

Figure 2B:
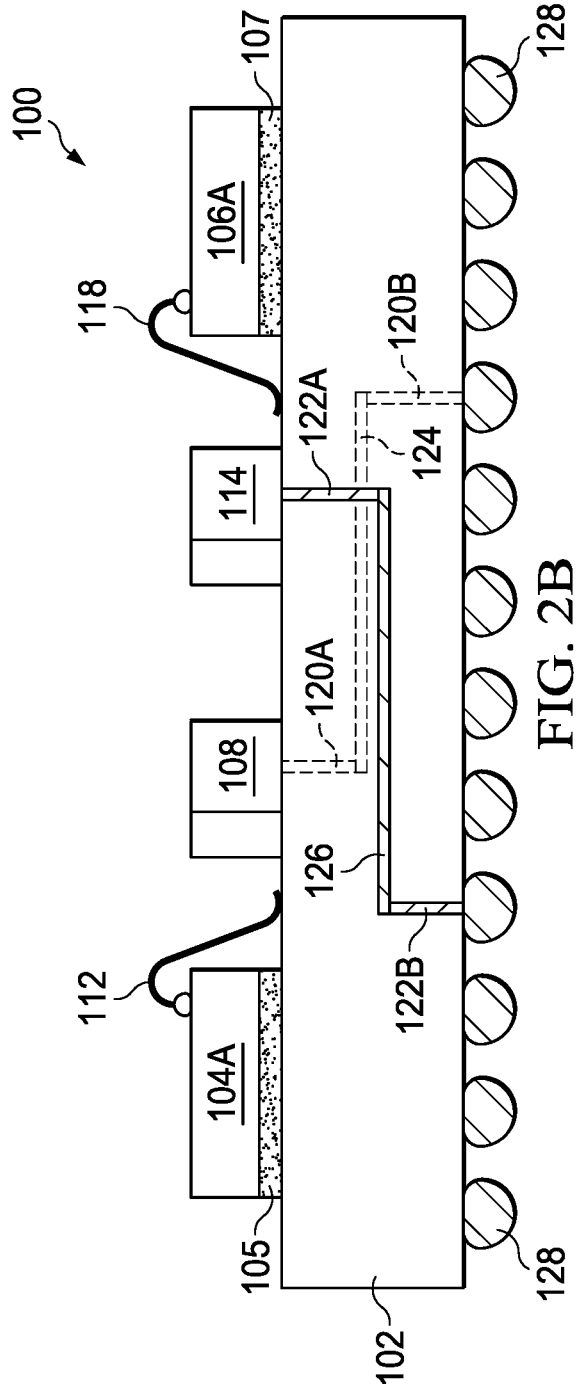
Figure 2C:
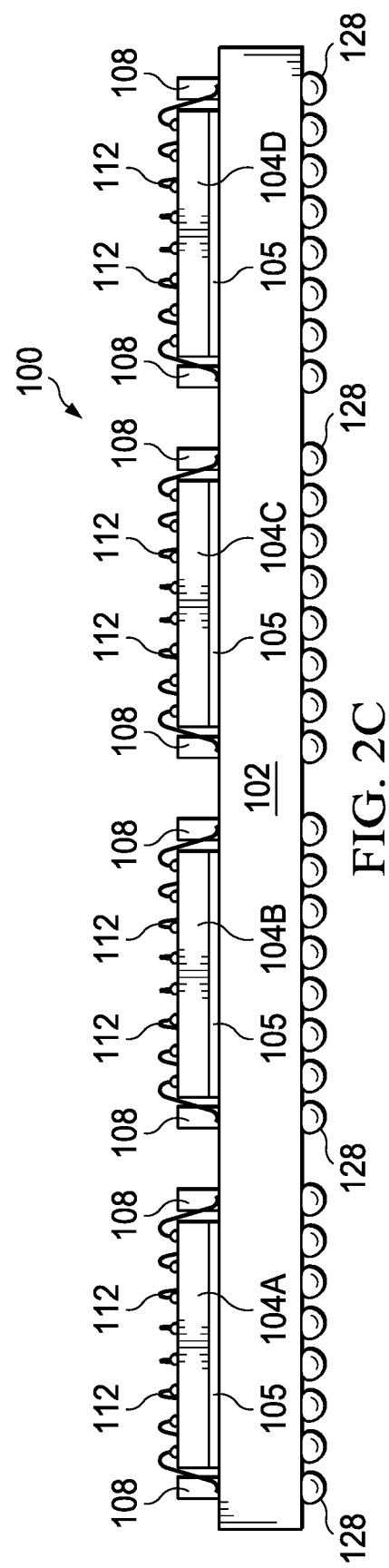
Figure 2D:
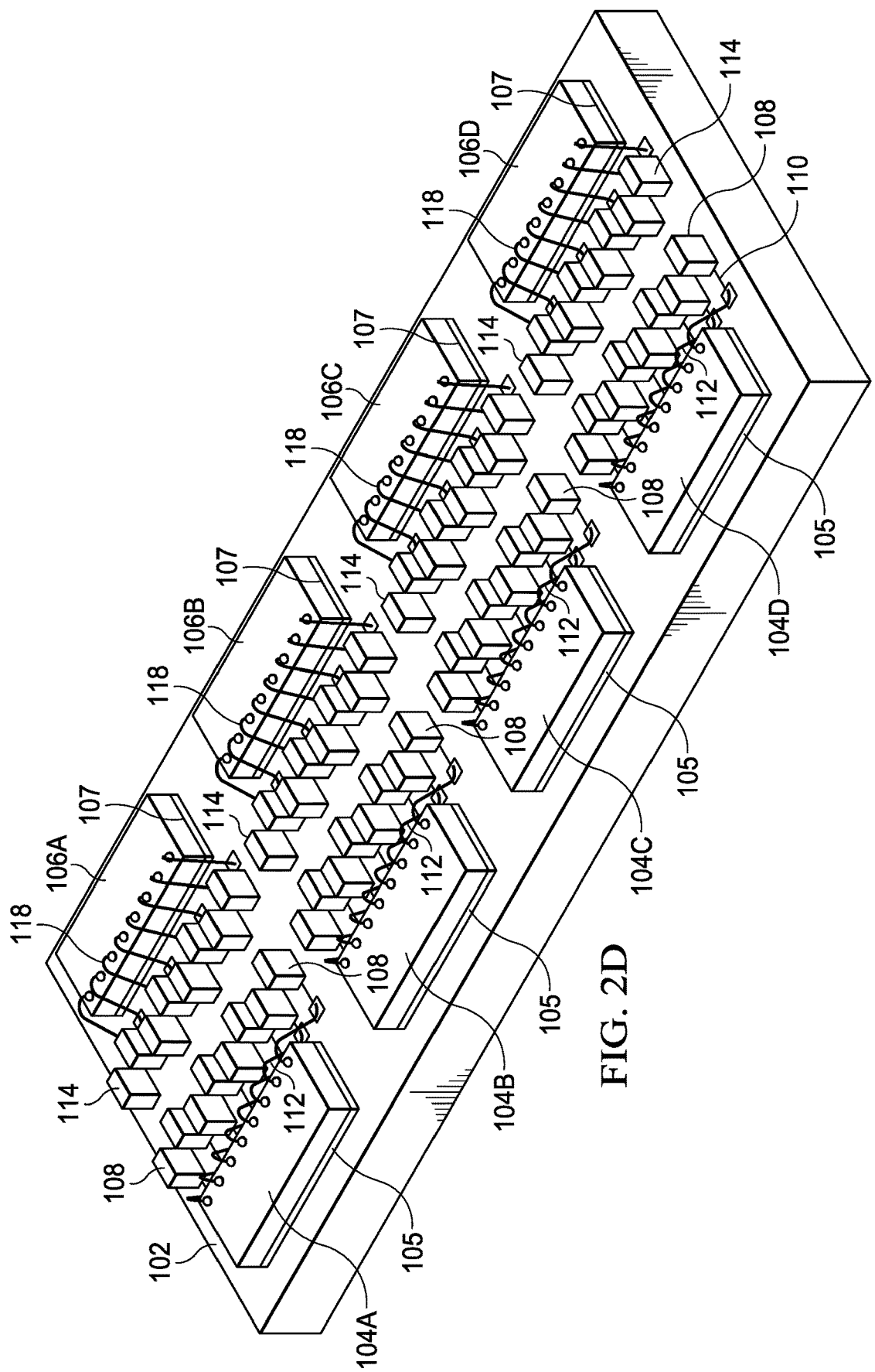
Figure 7C:
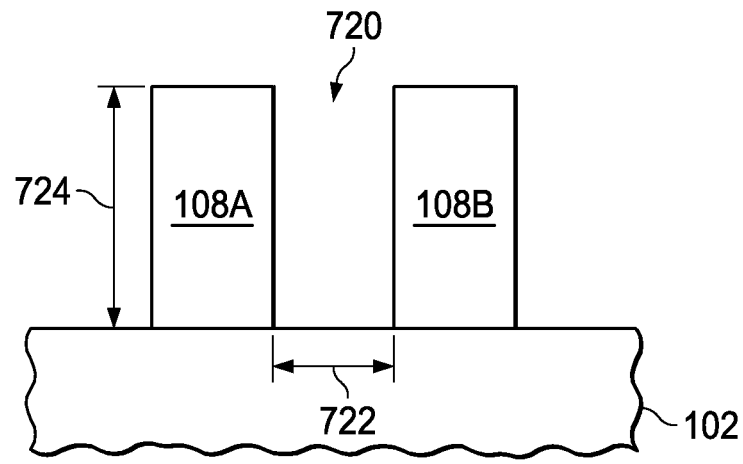
Figure 7D:
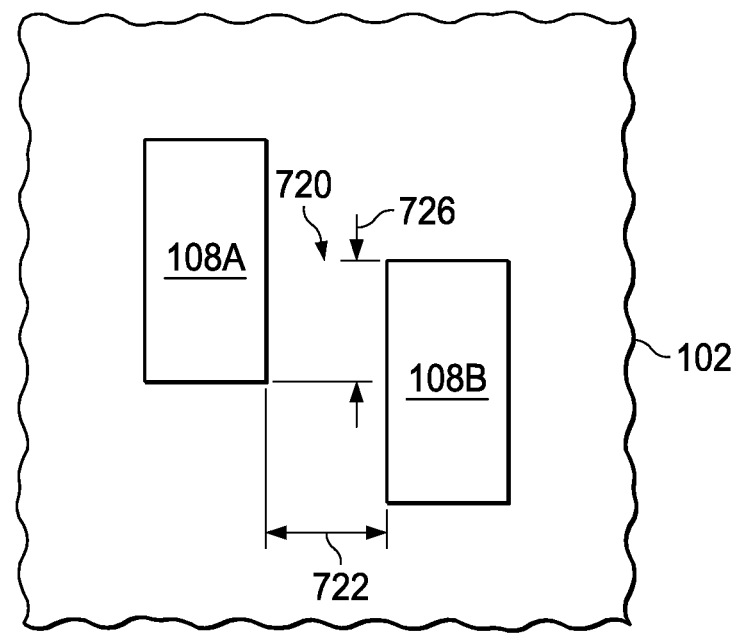

As described above, the risk of void formation during mold compound application may be mitigated by the parameters of the capillaries formed between pairs of the passive components 108 and pairs of the passive components 114. However, in examples, the risk of void formation also may be mitigated by the arrangement of the passive components 108, 114 relative to the space available between the columns of semiconductor dies 104A-104D, 106A-106D. A more staggered or distributed arrangement of the passive components 108, 114 results in improved mold compound flow and fewer voids. Staggering a pair of passive components 108, 114 means offsetting the passive components in the pair relative to each other so that they are not arranged in a fully aligned column as in FIG. 1A, but rather they are arranged in a staggered column as shown in FIG. 2A. FIG. 2A is a top-down view of a portion of a semiconductor package having passive components 108, 114 to facilitate mold compound flow, in accordance with various examples. In particular, the structure of FIG. 2A is identical to the structure of FIGS. 1A-1D, except that the column of passive components 108 is arranged in a staggered pattern, and the column of passive components 114 is also arranged in a staggered pattern. In examples, only one of the columns of passive components 108, 114 is arranged in a staggered pattern. In examples, only a portion of a column of passive components 108, 114 is arranged in a staggered pattern. In examples, some, but not all, of each of the columns of passive components 108, 114 are arranged in a staggered pattern. Any degree of staggering of the passive components 108, 114 in comparison to the structure of FIG. 1A achieves superior mold compound void mitigation and improved mold compound flow. FIG. 7C is a profile cross-sectional view of a pair of example passive components 108A, 108B. A gap 720 exists between the pair of passive components 108A, 108B, and the gap 720 is dimensioned to achieve capillarity. The gap 720 has a width 722 ranging from 100 microns to 500 microns, with a width smaller than this range being disadvantageous because it violates design rules required for manufacturability, and with a width above this range being disadvantageous because it is too large to achieve capillarity. In case the passive components 108A, 108B are capacitors, the gap 720 has a height 724 ranging from 850 microns to 900 microns, with a height smaller than this range being disadvantageous because it will not meet the capacitor value specification, and with a height above this range being disadvantageous for the same reason. FIG. 7D is a top-down view of the structure of FIG. 7C. The gap 720 has a length 726 that ranges from 300 microns to 500 microns, with a length above this range being disadvantageous because the package would become unacceptably large, and with a length below this range being disadvantageous because it would violate component-to-component design spacing rules required for manufacturability. The gap 720 has a cross-sectional area ranging from 0.075 mm$^2$ to 0.09 mm$^2$, with cross-sectional areas below this range being disadvantageous because it would result in an unacceptably large package and with cross-sectional areas above this range being disadvantageous because it violates the component-to-component design spacing rules required for manufacturability. If the passive components 108A, 108B are capacitors, the gap 720 has a volume ranging from 1 mm$^3$ to 1.5 mm$^3$, with volumes below this range being disadvantageous because they would not meet the capacitor value specification, and with volumes above this range being disadvantageous because they would interfere with mold compound flow. Although the length 726 represents the degree of left-to-right overlap between the passive components 108A, 108B, this degree of overlap may increase or decrease, thereby resulting in lengths 726 at the smaller or the greater ends of the range provided above. FIG. 2B is a profile cross-sectional view of the structure of FIG. 2A, in accordance with various examples. FIG. 2C is a profile view of the structure of FIG. 2A, in accordance with various examples. FIG. 2D is a perspective view of the structure of FIG. 2A, in accordance with various examples.

Figure 3B:
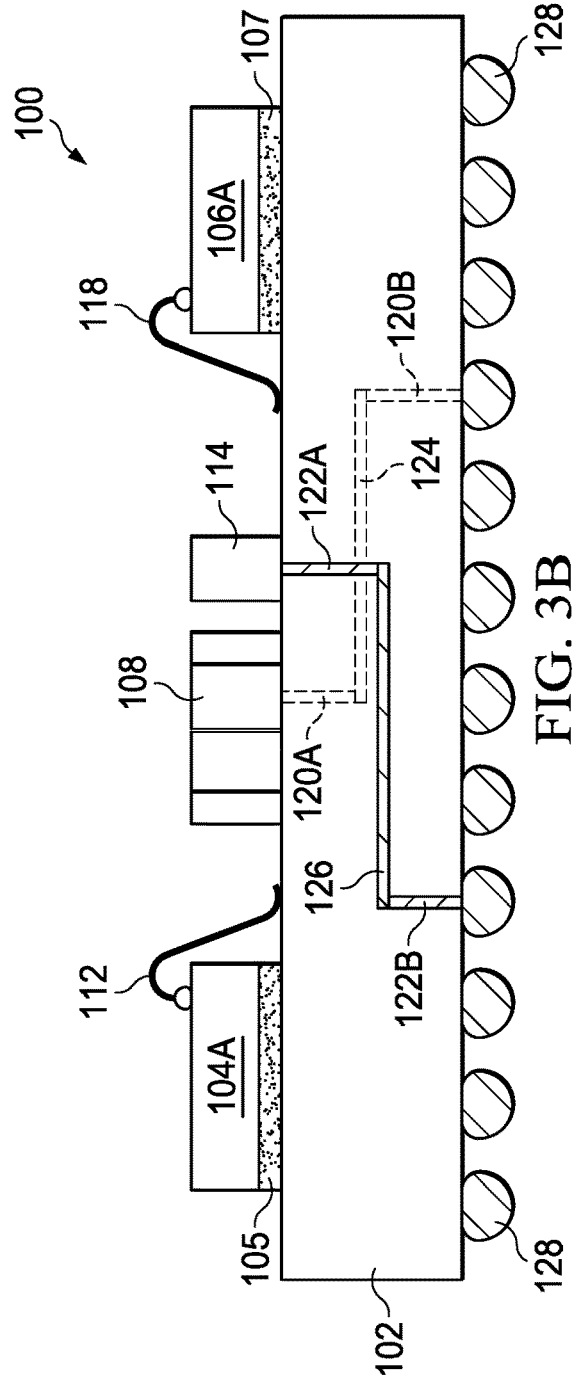
Figure 3C:
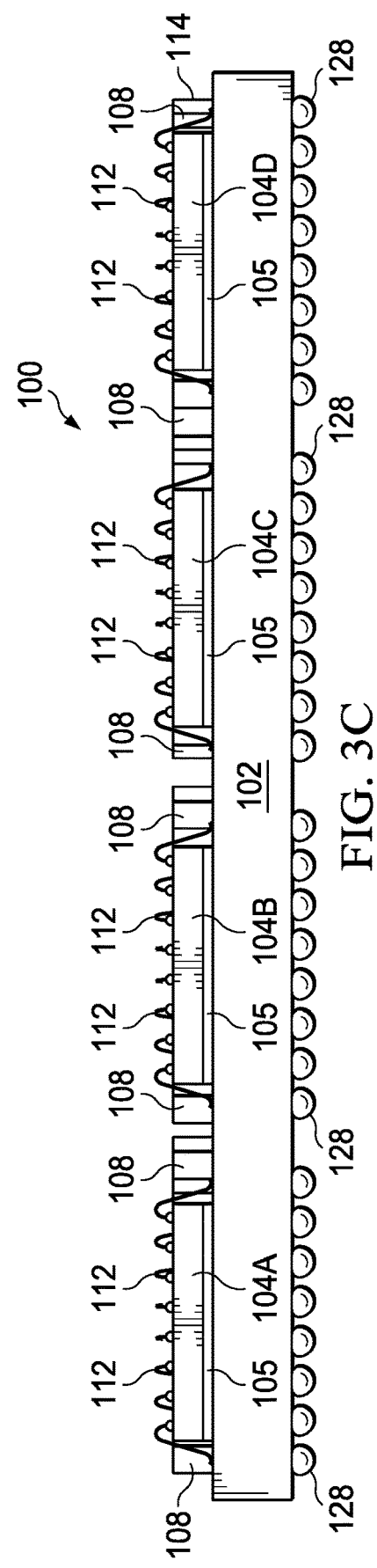
Figure 3D:
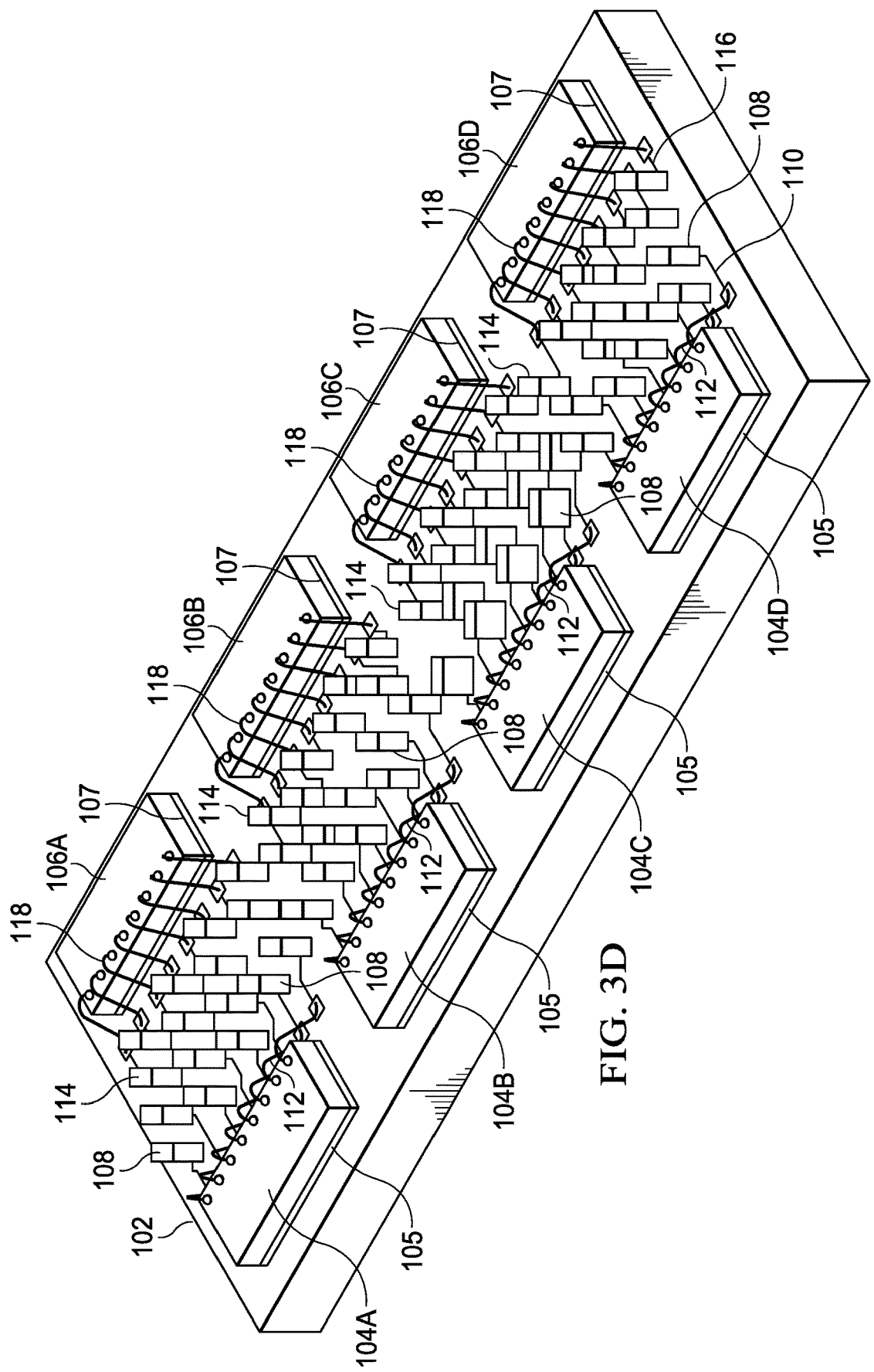
Figure 7E:
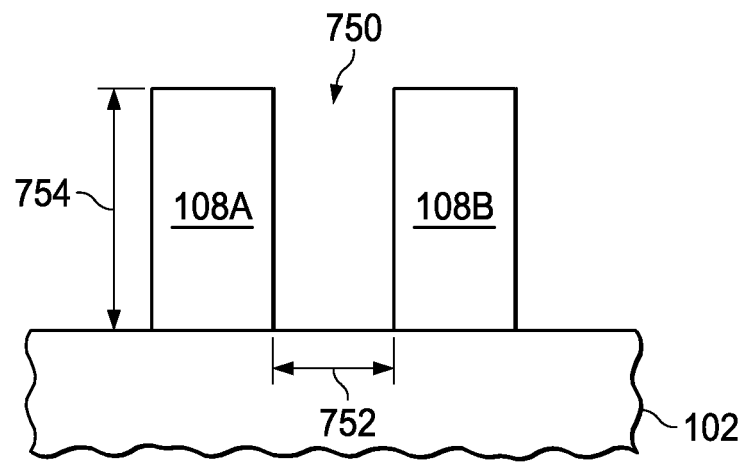
Figure 7F:
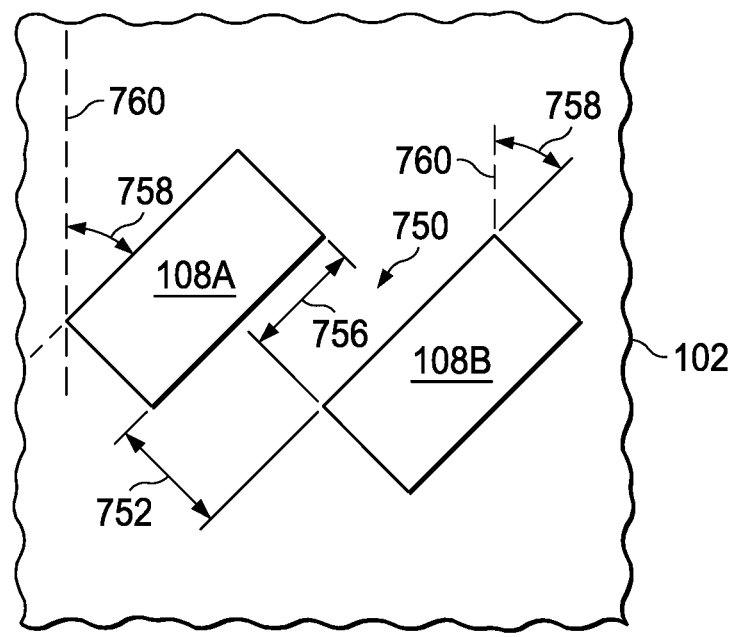

An angled orientation of the passive components 108, 114 results in improved mold compound flow and fewer voids. FIG. 3A is a top-down view of a portion of a semiconductor package having passive components 108, 114 to facilitate mold compound flow, in accordance with various examples. In particular, the structure of FIG. 3A is identical to the structures of FIGS. 1A-1D and 2A-2D, except that the column of passive components 108 is arranged in a staggered pattern and at angles relative to the length (e.g., an edge) of the substrate 102, and the column of passive components 114 is also arranged in a staggered pattern at angles relative to the length of the substrate 102. In examples, only one of the columns of passive components 108, 114 is angled. In examples, only a portion of a column of passive components 108, 114 is angled. In examples, some, but not all, of each of the columns of passive components 108, 114 are angled. Any degree of angling of the passive components 108, 114 in comparison to the structure of FIG. 1A achieves superior mold compound void mitigation and improved mold compound flow. FIG. 7E is a profile cross-sectional view of a pair of example passive components 108A, 108B. A gap 750 exists between the pair of passive components 108A, 108B, and the gap 750 is dimensioned to achieve capillarity. The gap 750 has a width 752 ranging from 1 micron to 500 microns, with a width above this range being disadvantageous because it is too large to achieve capillarity. If the passive components 108A, 108B are capacitors, the gap 750 has a height 754 ranging from 850 microns to 900 microns, with a height smaller than this range being disadvantageous because it will not meet the capacitor value specification, and with a height above this range being disadvantageous for the same reason. FIG. 7F is a top-down view of the structure of FIG. 7E. The gap 750 has a length 756 that ranges from 300 microns to 500 microns, with a length above this range being disadvantageous because it would result in an unacceptably large package, and with a length below this range being disadvantageous because it would violate design rules required for manufacturability. The gap 750 has a cross-sectional area ranging from 0.075 mm$^2$ to 0.09 mm$^2$, with cross-sectional areas below this range being disadvantageous because it would produce unacceptably large packages, and with cross-sectional areas above this range being disadvantageous because it would violate the component-to-component design spacing rules required for manufacturability. If the passive components 108A, 108B are capacitors, the gap 750 has a volume ranging from 1 mm$^3$ to 1.5 mm$^3$, with volumes below this range being disadvantageous because they would not meet the capacitor value specification, and with volumes above this range being disadvantageous because they would interfere with mold compound flow. Although the length 756 represents the degree of left-to-right overlap (e.g., staggering) between the passive components 108A, 108B, this degree of overlap may increase or decrease, thereby resulting in lengths 756 at the smaller or the greater ends of the range provided above. In addition, the passive component 108A has an angle 758 relative to line 760, where line 760 is approximately parallel to an edge (e.g., length) of the substrate 102. Similarly, the passive component 108B has the angle 758 relative to line 760. Although the passive components 108A, 108B are angled similarly relative to line 760, in examples, the passive components 108A, 108B are at different angles relative to line 760. The angle 758 ranges from 30 degrees to 60 degrees, with an angle larger than this range being disadvantageous because signal routing traces will have an increased number of transitions that will negatively impact performance, and with an angle smaller than this range being disadvantageous because of an unacceptably increased risk of poor mold compound flow and thus the formation of voids. An angle 758 of 45 degrees is superior to other angles, because it promotes the greatest degree of capillarity and mitigation of void formation. Thus, while it is critical for angle 758 to be in the range of 30 to 60 degrees for the reasons provided above, within this range, 45 degrees provides the greatest benefit. Although FIG. 7F depicts both staggering and angling of the passive components 108A, 108B, in some examples, the passive components 108A, 108B are angled as described above without any staggering. FIG. 3B is a profile cross-sectional view of the structure of FIG. 3A, in accordance with various examples. FIG. 3C is a profile view of the structure of FIG. 3A, in accordance with various examples. FIG. 3D is a perspective view of the structure of FIG. 3A, in accordance with various examples.

The passive components 108, 114 are distributed between the columns of semiconductor dies 104A-104D and 106A-106D in a way that mitigates the risk of mold compound void formation. The passive components 108, 114 are distributed such that between the columns of semiconductor dies 104A-104D and 106A-106D, no area of the top surface of the substrate 102 larger than 3 mm$^2$ is unoccupied by a passive component 108, 114. By avoiding large areas of the substrate 102 top surface that are empty (not occupied by a passive component), the risk of void formation is mitigated.

Figure 4A:
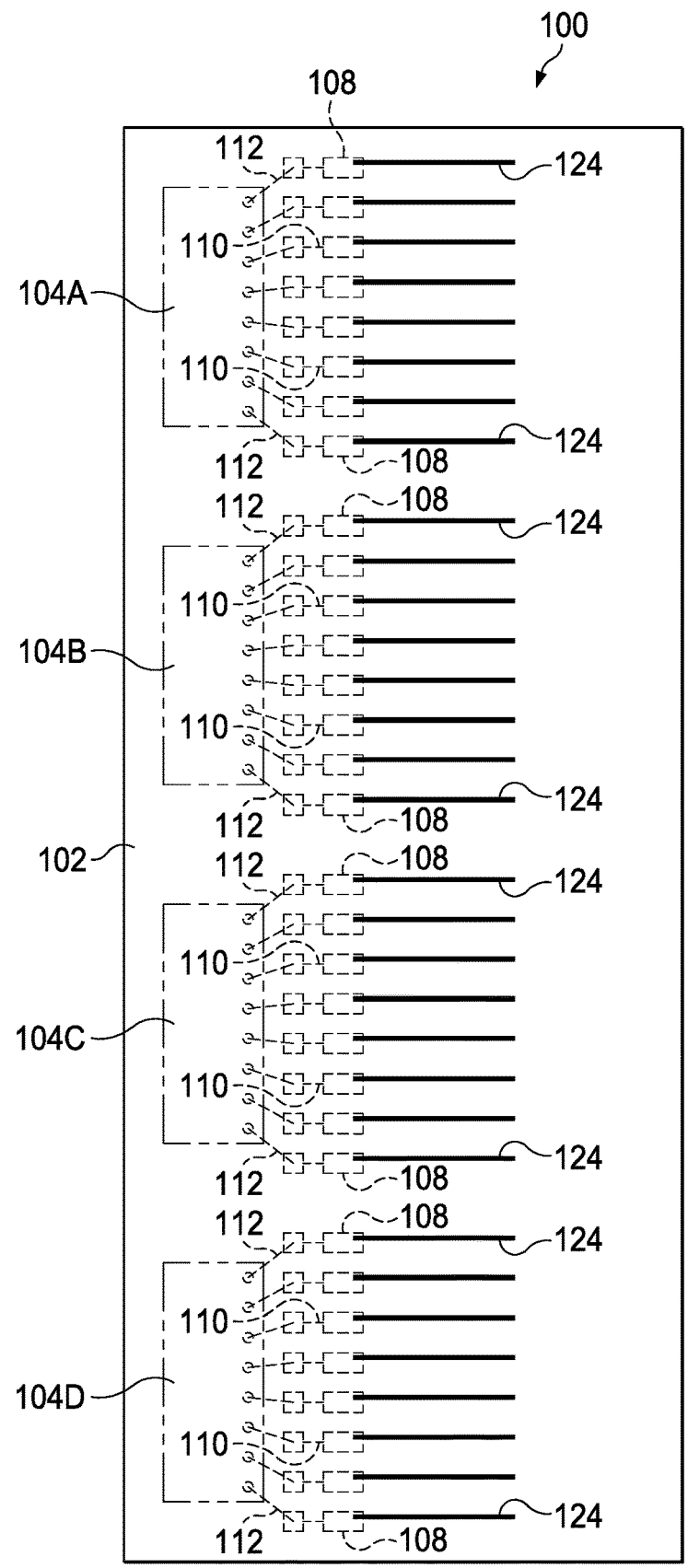
FIG. 4A is a top-down view of a substrate layer of a semiconductor package having passive components to facilitate mold compound flow, in accordance with various examples.
Figure 4B:
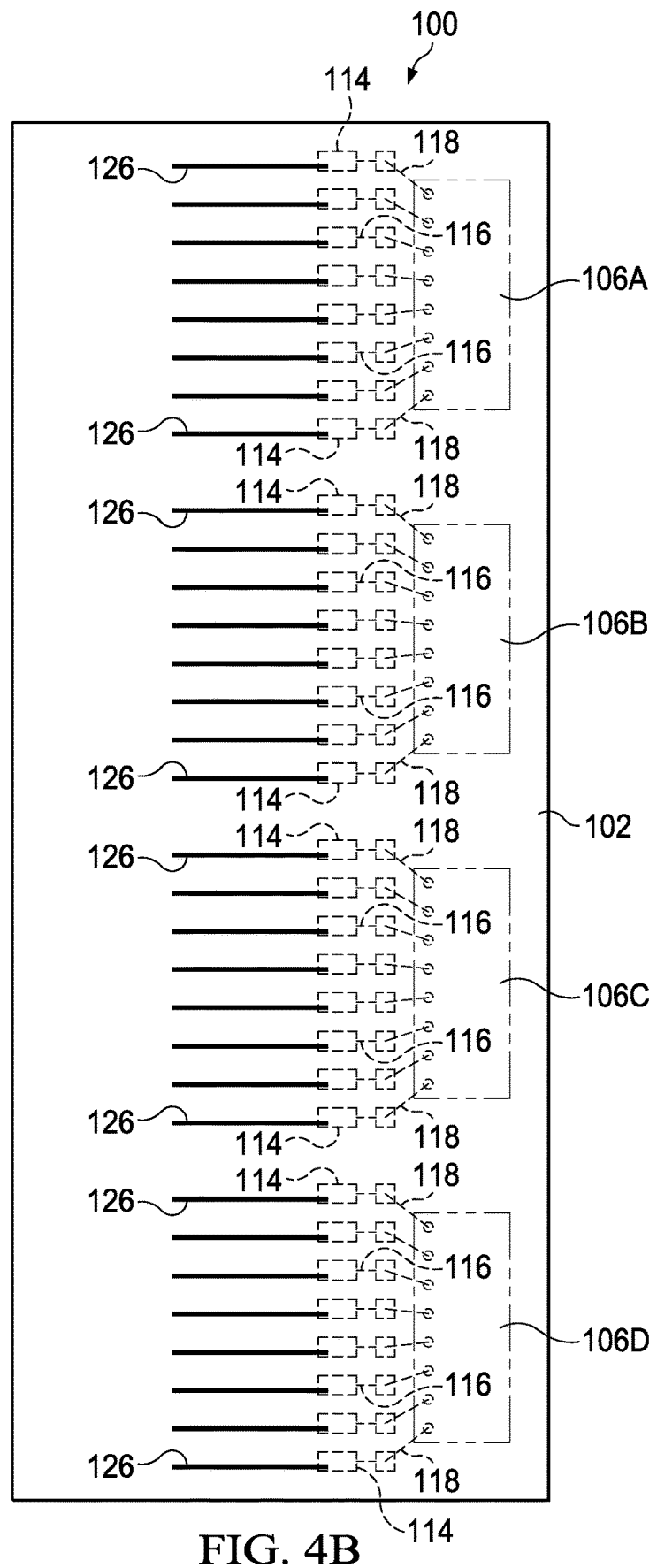
FIG. 4B is a top-down view of a substrate layer of a semiconductor package having passive components to facilitate mold compound flow, in accordance with various examples.

FIG. 4A is a top-down view of a layer of the substrate 102 that is below the top surface of the substrate 102, in accordance with various examples. FIG. 4A depicts the semiconductor dies 104A-104D in dashed lines as a frame of reference, although the semiconductor dies 104A-104D are not present in the layer of the substrate 102 shown in FIG. 4A. The substrate 102 layer shown in FIG. 4A includes the conductive traces 124. The conductive traces 124 couple to respective terminals of the passive components 108 by way of vias (e.g., vias 120A of FIG. 1B) that extend from the layer of the substrate 102 shown in FIG. 4A to the top surface of the substrate 102, as FIG. 1B shows. In examples, the conductive traces 124 are composed of copper. Each of the conductive traces 124 has a structure, size, and location such that no point of any conductive trace 124 is in vertical alignment with any point of any conductive trace 126 (FIGS. 1B and 4B). While the left-side ends of the conductive traces 124 are coupled to the passive components 108 by way of vias, the opposing ends of the conductive traces 124 (on the right side of FIG. 4A) are coupled to conductive terminals 128, for example through vias 120B (FIG. 1B). The structure of the conductive traces 124 as shown in FIGS. 1B and 4A enables the passive components 108 to be positioned on the top surface of the substrate 102 between the columns of semiconductor dies 104A-104D, 106A-106D without requiring a change in the pinout of the conductive terminals 128 and without requiring a change in the pins of the semiconductor dies 104A-104D, 106A-106D relative to what they would be had the passive components 108 been positioned between a column of semiconductor dies and an edge of the substrate 102 (e.g., along a perimeter of the substrate 102).

FIG. 4B is similar to FIG. 4A, except that FIG. 4B depicts the structure of a different layer of the substrate 102 than FIG. 4A. More specifically, FIG. 4B depicts a layer of the substrate 102 in which the conductive traces 126 are positioned. The conductive traces 126 couple to respective passive components 114 by way of vias 122A (FIG. 1B), and they couple to respective conductive terminals 128 by way of vias 122B (FIG. 1B). The structure of the conductive traces 126 as shown in FIGS. 1B and 4B enables the passive components 114 to be positioned on the top surface of the substrate 102 between the columns of semiconductor dies 104A-104D, 106A-106D without requiring a change in the pinout of the conductive terminals 128 and without requiring a change in the pins of the semiconductor dies 104A-104D, 106A-106D relative to what they would be had the passive components 114 been positioned between a column of semiconductor dies and an edge of the substrate 102.

Figure 4C:
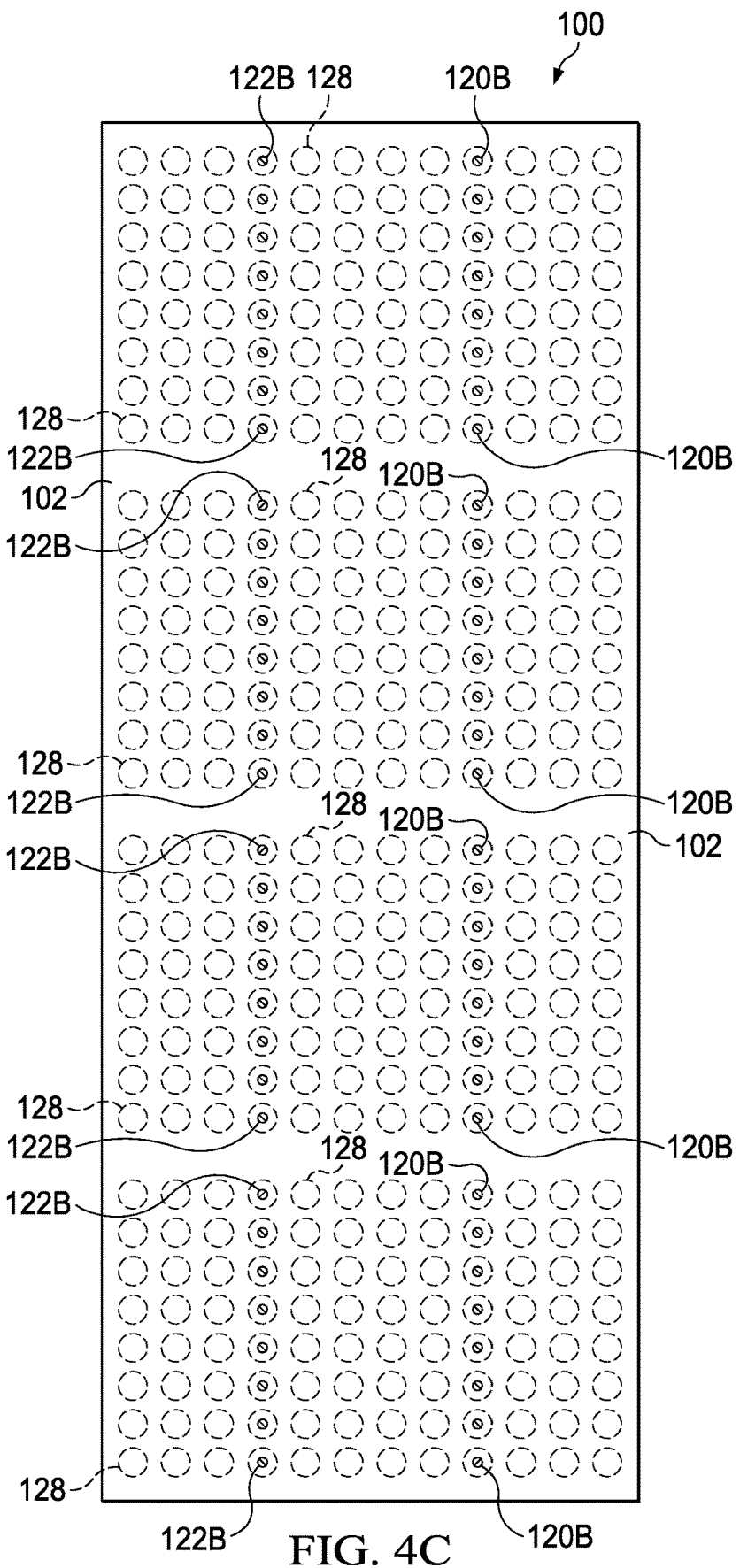
FIG. 4C is a top-down view of a substrate layer of a semiconductor package having passive components to facilitate mold compound flow, in accordance with various examples.

FIG. 4C is a top-down view of a bottom layer of the substrate 102, in accordance with various examples. The conductive terminals 128 are coupled to a bottom surface of the layer of FIG. 4C but are not present in the layer of FIG. 4C, and thus the conductive terminals 128 are shown in dashed lines. The layer shown in FIG. 4C is, for example, a layer that contains the vias 120B and 122B, which couple respective conductive traces 124, 126 to the conductive terminals 128 (FIG. 1B).

Figure 5A:
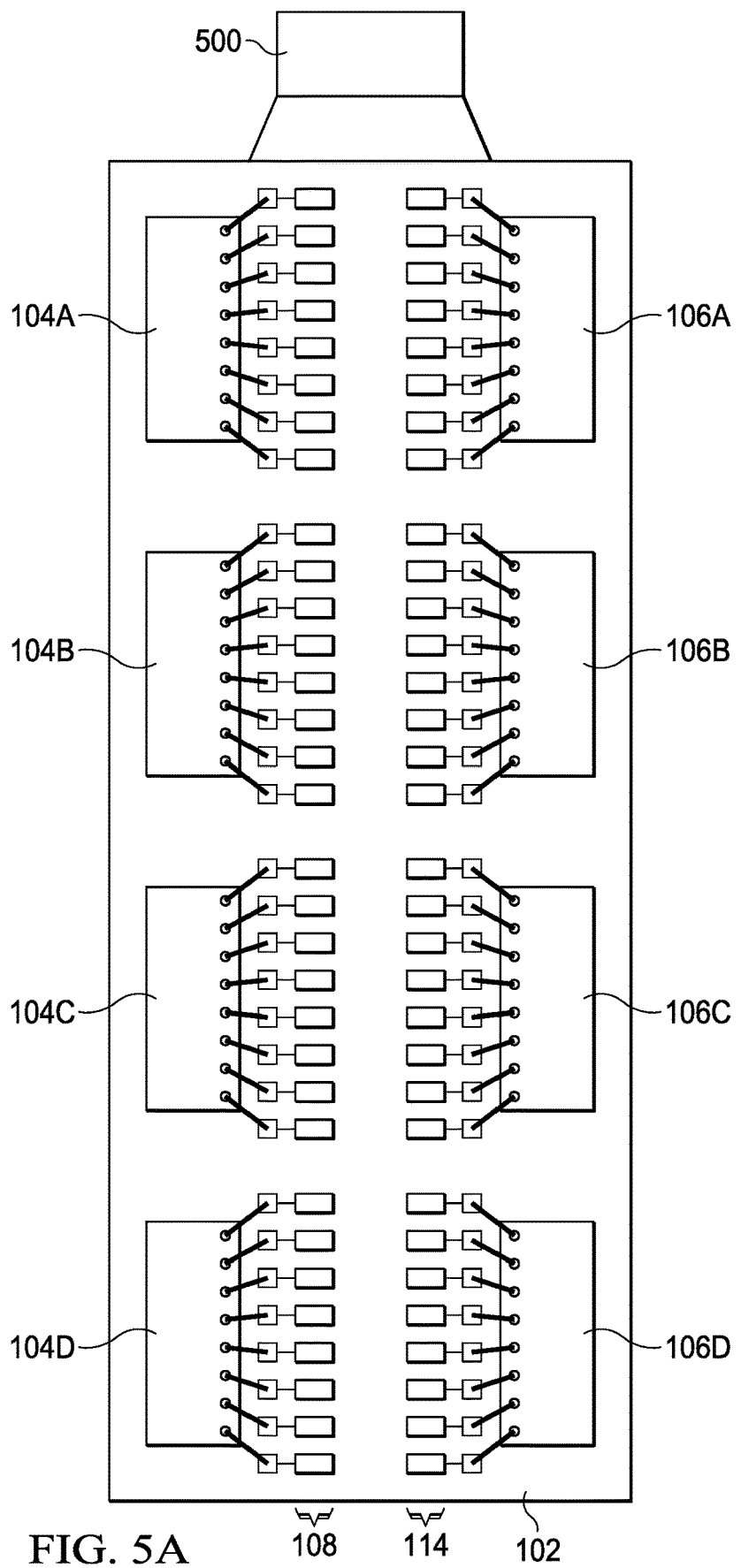
FIGS. 5A-5F are top-down views of a mold compound flow simulation on various substrates having passive components to facilitate mold compound flow, in accordance with various examples.
Figure 5B:
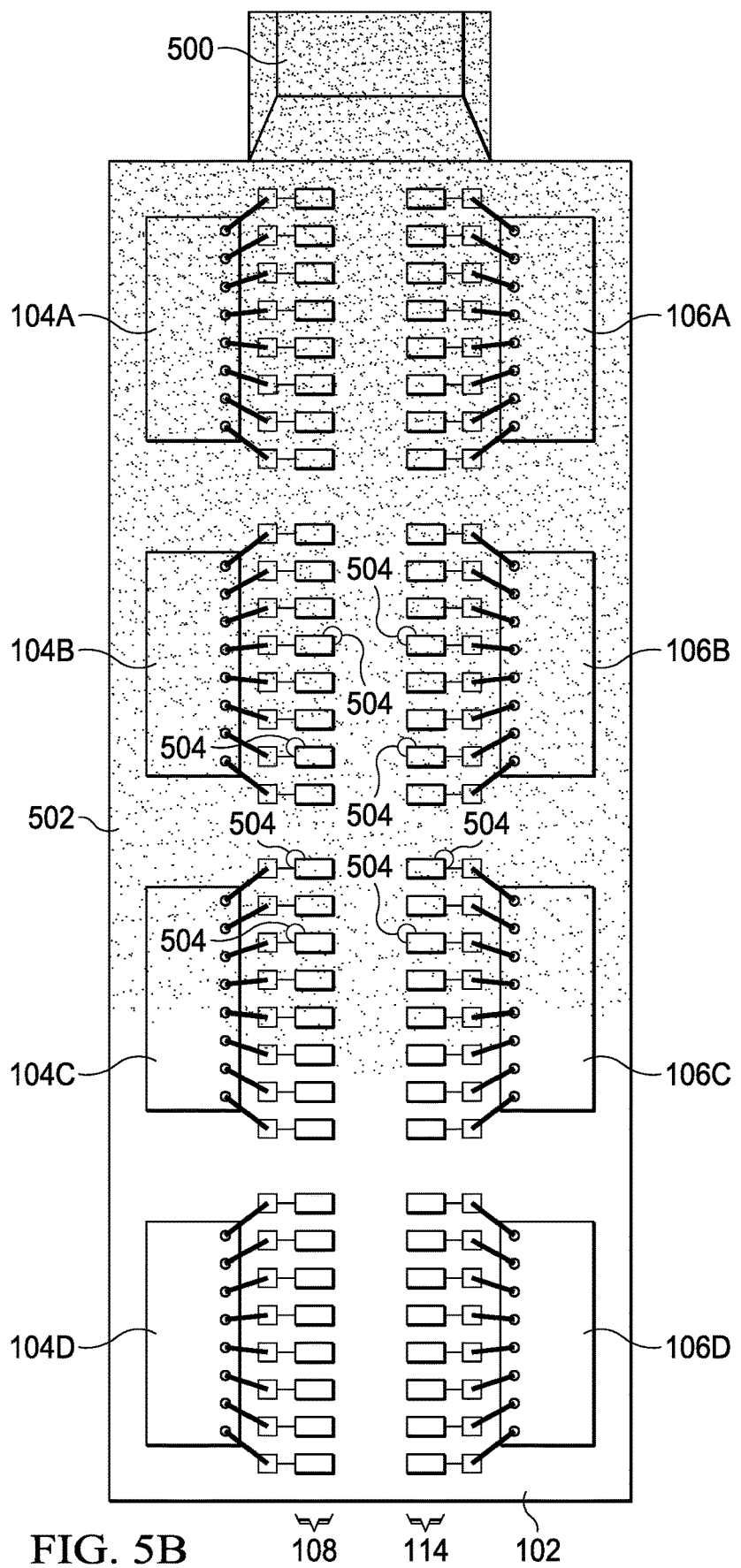
Figure 5C:
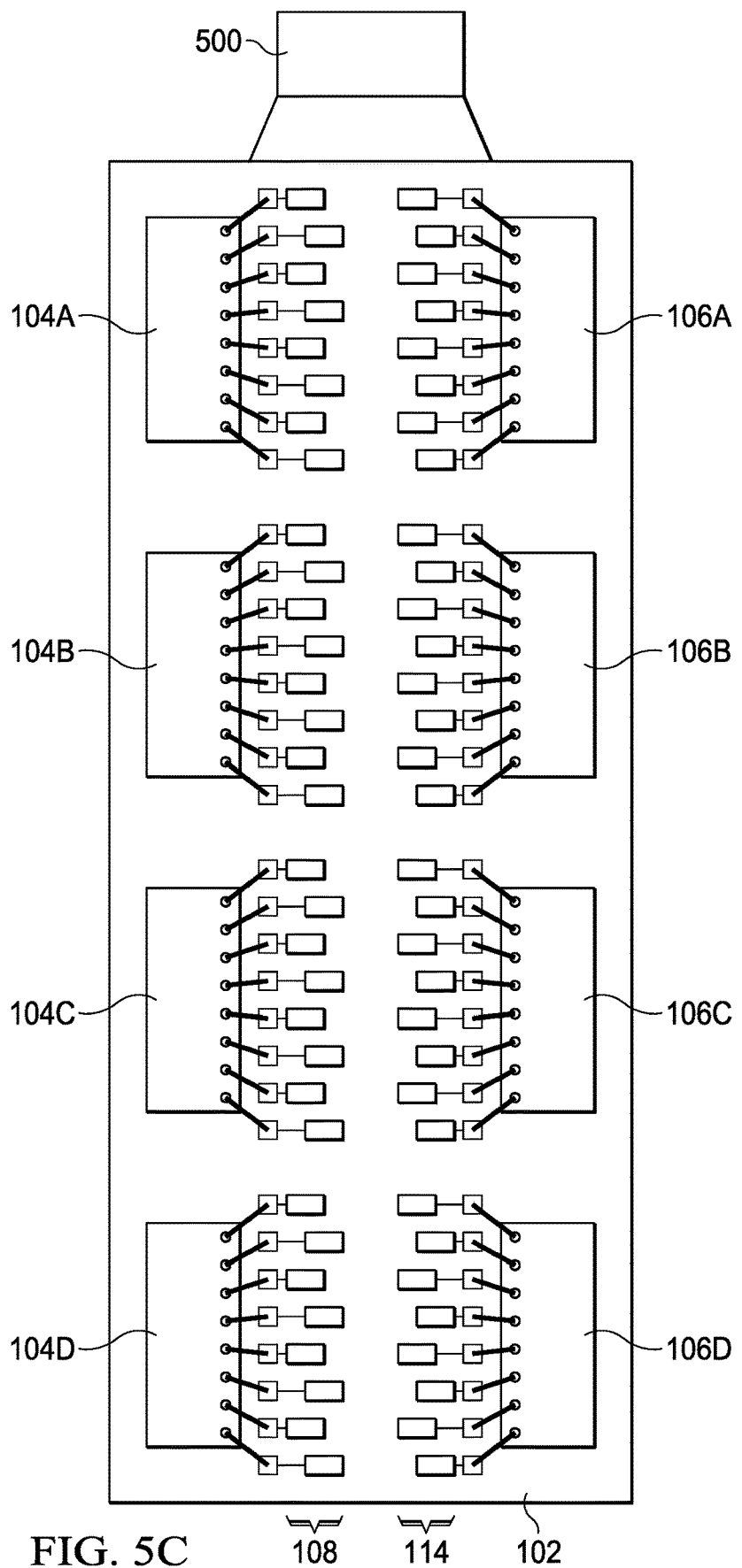
Figure 5D:
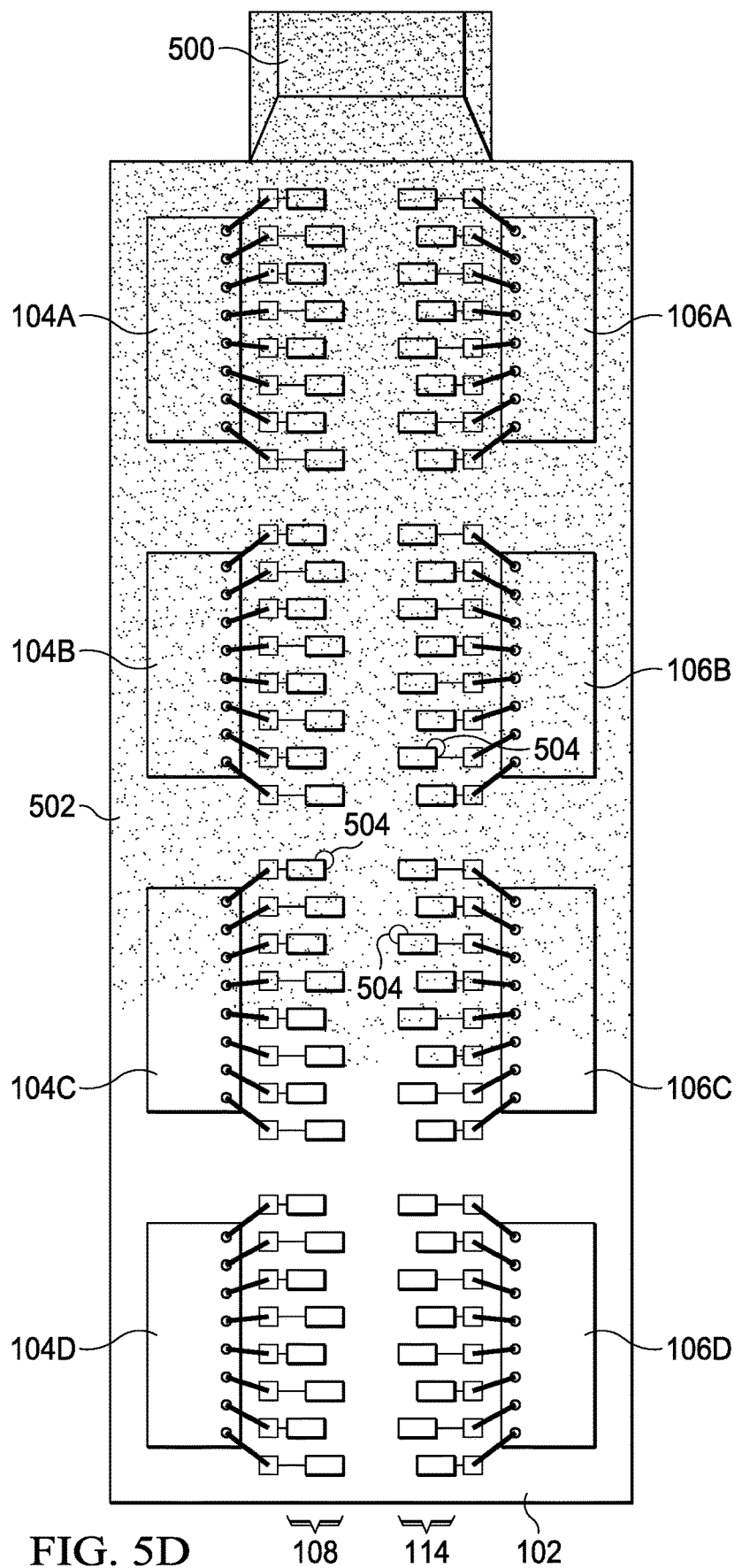
Figure 5E:
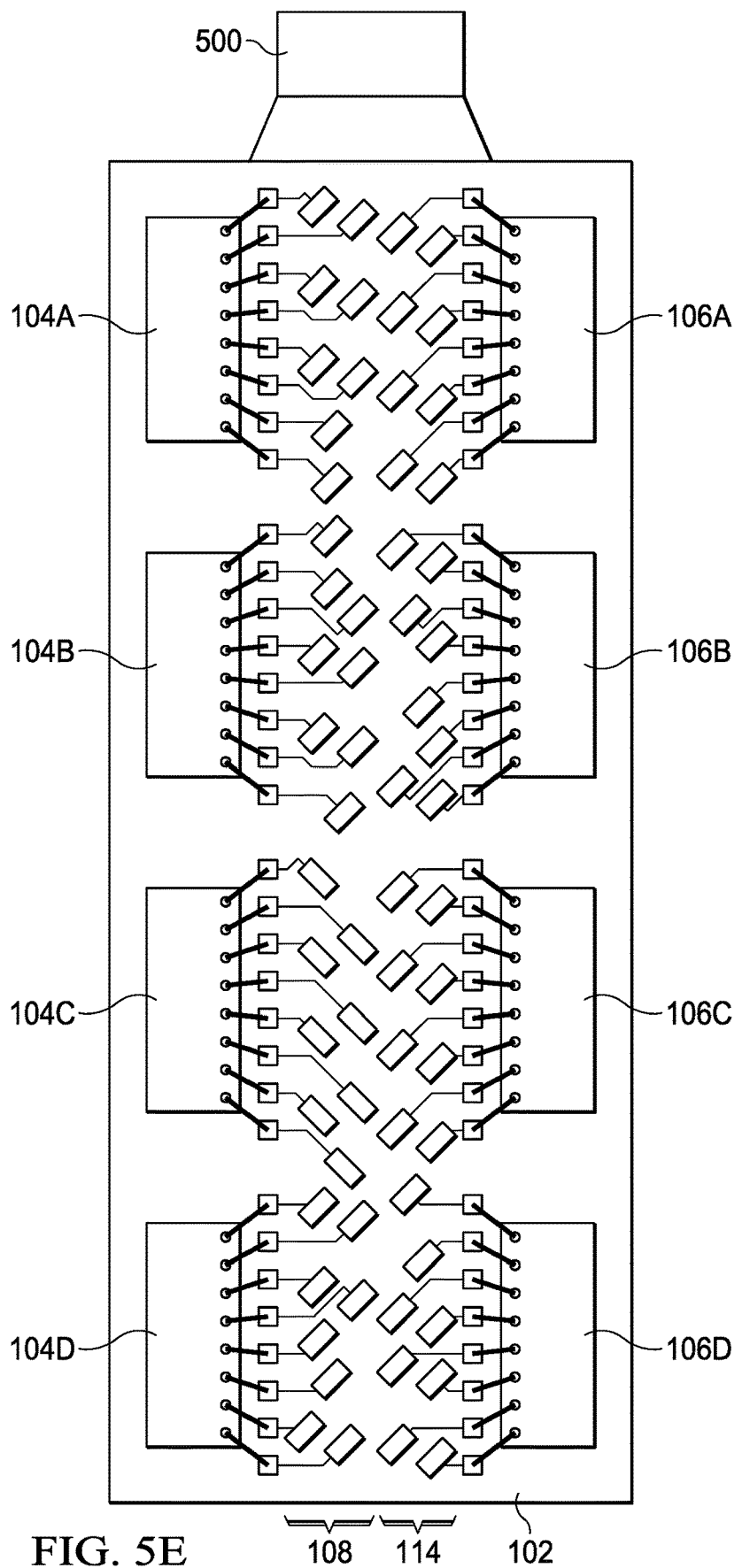
Figure 5F:
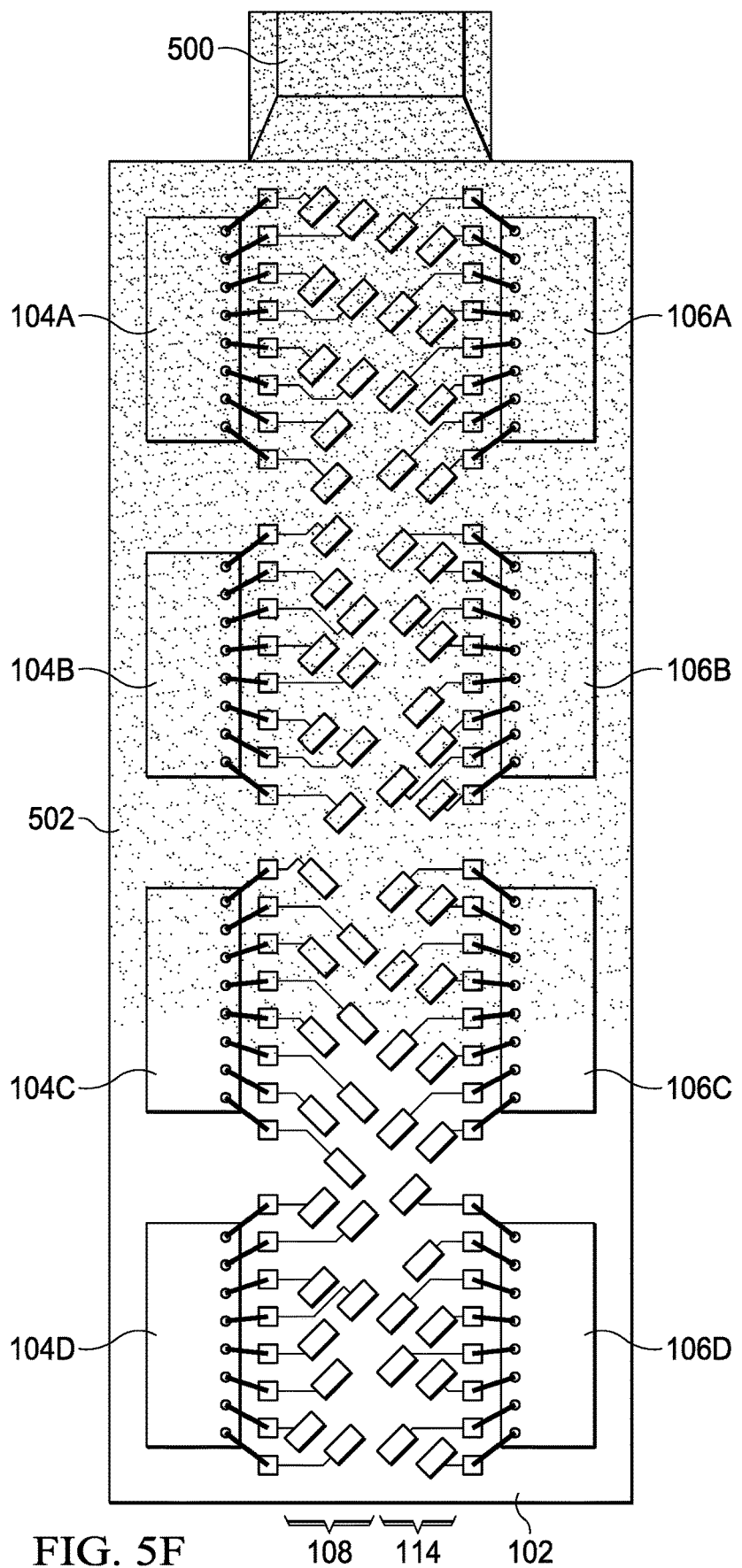

FIGS. 5A-5F are top-down views of a mold compound flow simulation on various examples of the substrate 102 having passive components to facilitate mold compound flow, in accordance with various examples. The mold compound flow simulations of FIGS. 5A-5F demonstrate the superior mitigation of mold compound void formation relative to other structures (e.g., those in which the passive components are arranged along a perimeter of the substrate 102 instead of in between columns of semiconductor dies as in FIGS. 5A-5F). FIG. 5A shows the structure of FIG. 1A, but with the addition of a mold compound application apparatus 500 through which mold compound is injected or otherwise applied to the substrate 102. FIG. 5B shows a mold compound 502 being applied to the substrate 102. The structural features of the substrate 102, and more specifically of the passive components 108, 114, affect the mold compound flow to result in the formation of fewer voids 504 than would otherwise be the case. Similarly, FIG. 5C shows the structure of FIG. 2A, but with the addition of the mold compound application apparatus 500 to apply mold compound 502 to the substrate 102. The structural features of the substrate 102, and more specifically of the passive components 108, 114, affect the mold compound flow to result in the formation of fewer voids 504 (FIG. 5D) than would otherwise be the case. Further, the staggered pattern of the passive components 108, 114 produces fewer voids 504 than produced in the examples of FIGS. 5A and 5B. Further, FIG. 5E shows the structure of FIG. 3A, but with the addition of the mold compound application apparatus 500 to apply mold compound 502 to the substrate 102. The structural features of the substrate 102, and more specifically of the passive components 108, 114, affect the mold compound flow to result in the formation of fewer voids 504 (FIG. 5F) than would otherwise be the case. Further, the staggered and angled distribution and orientation of the passive components 108, 114 produces fewer voids 504 than produced in the examples of FIGS. 5A-5D. As shown in FIG. 5F, the staggered and angled distribution and orientation of the passive components 108, 114 results in the formation of no voids 504 in this simulation. The simulation shown in FIGS. 5A-5F thus provides evidence of the significant impact the distribution and angular orientation of passive components 108, 114 has on mold compound flow and void formation.

Figure 6A:
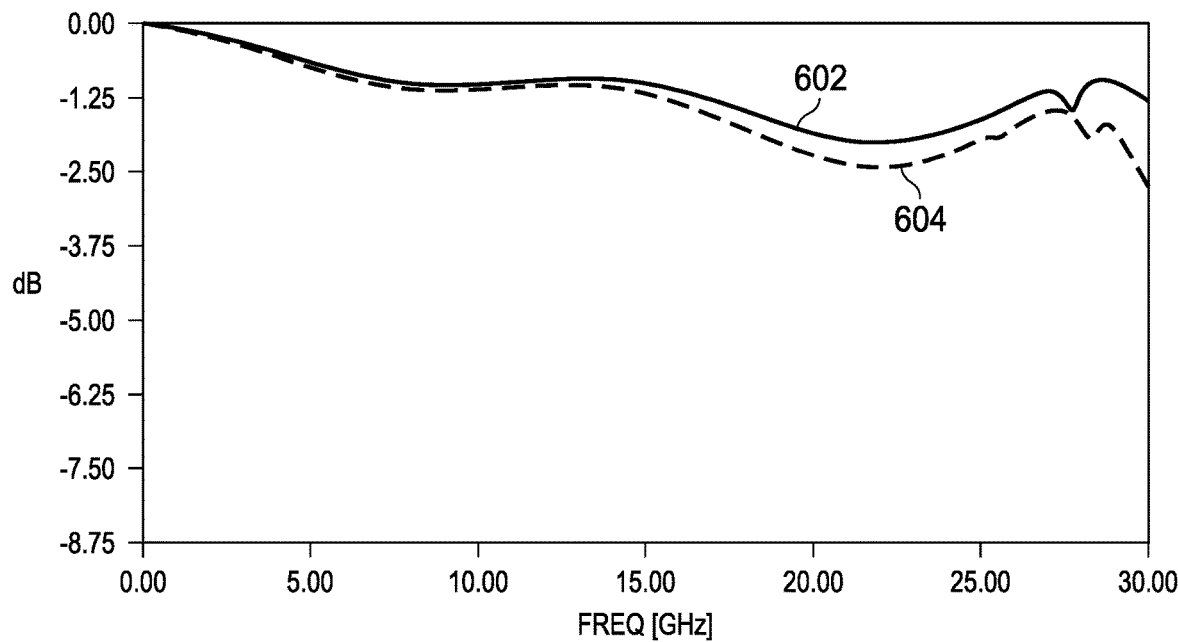
Figure 6B:
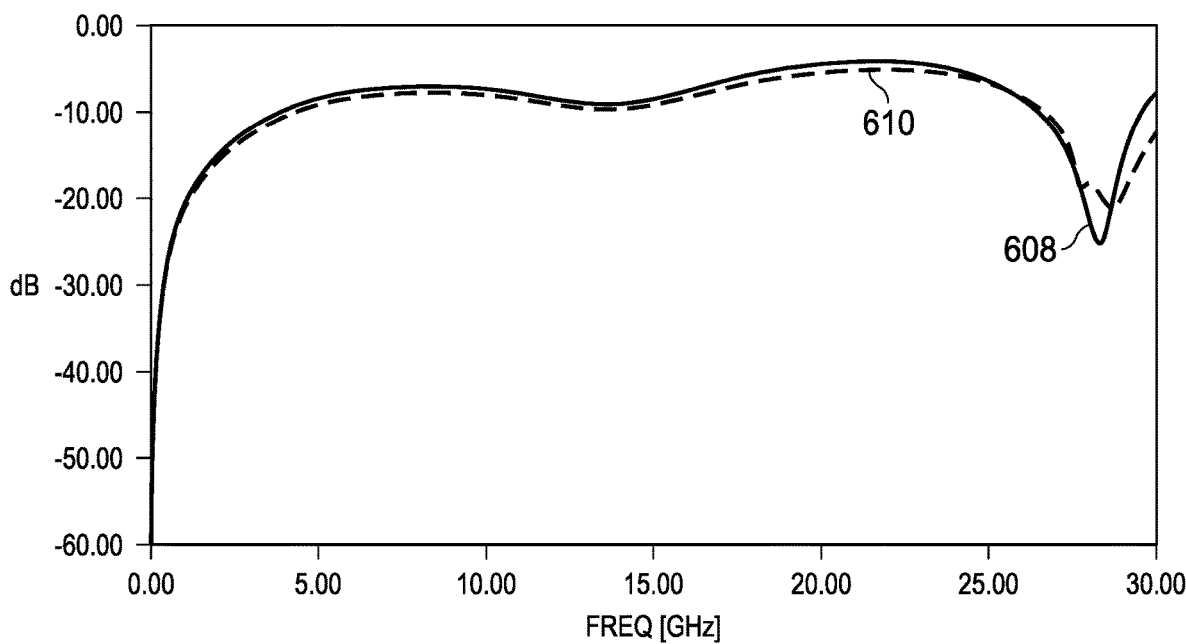

FIGS. 6A-6C are graphs depicting the electrical performance of semiconductor packages having passive components to facilitate mold compound flow, in accordance with various examples. In particular, FIG. 6A shows a graph 600 including curves 602 and 604 demonstrating differential insertion losses associated with the structures of FIGS. 1A and 3A during use. The x-axis indicates frequency of signals in Gigahertz (GHz) and the y-axis indicates differential insertion losses in decibels (dB). The curve 602 indicates the differential insertion losses as a function of frequency for the structure in FIG. 1A, and the curve 604 indicates the differential insertion losses as a function of frequency for the structure in FIG. 3A. Thus, as shown, the different structures have similar electrical performance when differential insertion losses are used as a metric.

FIG. 6B shows a graph 606 including curves 608 and 610 demonstrating differential return losses associated with the structures of FIGS. 1A and 3A during use. The x-axis indicates frequency of signals in Gigahertz (GHz) and the y-axis indicates differential return losses in decibels (dB). The curve 608 indicates the differential return losses as a function of frequency for the structure in FIG. 1A, and the curve 610 indicates the differential return losses as a function of frequency for the structure in FIG. 3A. Thus, as shown, the different structures have similar electrical performance when differential return losses are used as a metric.

FIG. 6C shows a graph 612 including curves 614 and 616 demonstrating crosstalk associated with the structures of FIGS. 1A and 3A during use. The x-axis indicates frequency of signals in Gigahertz (GHz) and the y-axis indicates degree of crosstalk in decibels (dB). The curve 614 indicates the degree of crosstalk as a function of frequency for the structure in FIG. 1A, and the curve 616 indicates the degree of crosstalk as a function of frequency for the structure in FIG. 3A. Thus, as shown, the different structures have similar electrical performance when differential return losses are used as a metric.

FIG. 8 is a perspective view of a semiconductor package 100 having passive components to facilitate mold compound flow, in accordance with various examples. The semiconductor package 100 includes a substrate 102 and a mold compound 502. The substrate 102 may include and have coupled thereto various structures, such as semiconductor dies, passive components, conductive traces, bond wires, etc. so as to be identical or similar to the example substrates 102 described herein with reference to FIGS. 1A-1D, 2A-2D, and 3A-3D. Further, the mold compound 502 may be applied as described above, resulting in a number of mold compound voids that is significantly less than would otherwise be the case, without compromising electrical performance or altering semiconductor die or semiconductor package pinout schemes.

FIG. 9 is a block diagram of an electronic device 900, in accordance with various examples. The electronic device 900 includes a printed circuit board (PCB) 902. The electronic device 900 also includes an example semiconductor package 100 coupled to the PCB 902. The semiconductor package 100 may be any of the example semiconductor packages 100 described herein and may include any of the example substrates 102 described herein.

FIG. 10 is a flow diagram of a method 1000 for manufacturing a semiconductor package having passive components to facilitate mold compound flow, in accordance with various examples. The method 1000 includes providing a substrate (e.g., substrate 102, FIG. 1B) having a first conductive trace (e.g., conductive trace 124, FIG. 1B) coupled to a first conductive terminal of a ball grid array (e.g., conductive terminal 128, FIG. 1B) and a second conductive trace (e.g., conductive trace 126, FIG. 1B) coupled to a second conductive terminal of the ball grid array (e.g., conductive terminal 128, FIG. 1B), the first and second conductive traces having no point of overlap in a vertical axis (1002). The method 1000 includes coupling first and second semiconductor dies (e.g., semiconductor dies 104A, 106A, FIG. 1B) to a top surface of the substrate (1004). The method 1000 includes coupling a first passive component (e.g., passive component 108, FIG. 1B) to the top surface of the substrate between the first and second semiconductor dies, the first passive component having a first terminal coupled to the first semiconductor die and a second terminal coupled to the first conductive trace (1006). The method 1000 includes coupling a second passive component (e.g., passive component 114, FIG. 1B) to the top surface of the substrate between the first and second semiconductor dies, the second passive component having a first terminal coupled to the second semiconductor die and a second terminal coupled to the second conductive trace (1006). The method 1000 includes covering the substrate, the first and second semiconductor dies, and the first and second passive components with a mold compound (e.g., mold compound 502, FIG. 8), the first and second passive components having a gap (e.g., gap 750, FIG. 7F) therebetween that is dimensioned to enable the mold compound to flow through the gap using capillary action (1008).

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Unless otherwise stated, "about," "approximately," or "substantially" preceding a value means +/−10 percent of the stated value. Modifications are possible in the described examples, and other examples are possible within the scope of the claims.

What is claimed is:

1. A semiconductor package, comprising:
   a substrate;
   multiple columns of semiconductor dies positioned approximately in parallel along a length of the substrate;
   multiple passive components positioned between the multiple columns of semiconductor dies, the multiple passive components angled between 30 and 60 degrees relative to the length of the substrate, a pair of the multiple passive components having a gap therebetween that is configured to permit mold compound flow through capillary action; and
   a mold compound covering the substrate, the multiple columns of semiconductor dies, and the multiple passive components.

2. The semiconductor package of claim 1, wherein the multiple passive components include capacitors.

3. The semiconductor package of claim 1, wherein a first passive component of the multiple passive components includes first and second terminals, the first terminal of the first passive component coupled to a semiconductor die by way of a bond wire, and the second terminal of the second passive component coupled to a conductive terminal in a ball grid array of the semiconductor package by way of a first conductive trace of the substrate.

4. The semiconductor package of claim 3, wherein a second passive component of the multiple passive components includes first and second terminals, the first terminal of the second passive component coupled to another semiconductor die by way of another bond wire, and the second terminal of the second passive component coupled to another conductive terminal in the ball grid array of the semiconductor package by way of a second conductive trace of the substrate.

5. The semiconductor package of claim 1, wherein the gap has a width ranging from 1 micron to 500 microns.

6. The semiconductor package of claim 1, wherein the gap has a length ranging from 300 microns to 500 microns.

7. The semiconductor package of claim 1, wherein the gap has a height ranging from 850 microns to 900 microns.

8. A semiconductor package, comprising:
a substrate;
a first column of semiconductor dies arranged along a length of the substrate;
a second column of semiconductor dies arranged along the length of the substrate;
first and second columns of passive components positioned between the first and second columns of semiconductor dies and positioned along the length of the substrate; and
a mold compound covering the substrate, the first and second columns of semiconductor dies, and the first and second columns of passive components.

9. The semiconductor package of claim 8, wherein the first column of passive components includes multiple rows of passive components, and wherein the multiple rows are arranged in a staggered pattern relative to each other.

10. The semiconductor package of claim 9, wherein a first row of the multiple rows of passive components is staggered relative to a second row of the multiple rows of passive components.

11. The semiconductor package of claim 8, wherein the first and second columns of passive components are approximately parallel to each other.

12. The semiconductor package of claim 8, wherein passive components in the first column are angled between 30 and 60 degrees in a first direction relative to a line extending along the length of the substrate.

13. The semiconductor package of claim 8, wherein a pair of the passive components in the first column of passive components are separated by a gap ranging in width from 100 microns to 500 microns.

14. The semiconductor package of claim 13, wherein the gap has a length ranging from 1500 microns to 1700 microns.

15. The semiconductor package of claim 13, wherein the gap has a height ranging from 850 microns to 900 microns.

16. The semiconductor package of claim 8, wherein a first terminal of a passive component in the first column of passive components is coupled to a semiconductor die in the first column of semiconductor dies by way of a bond wire, and wherein a second terminal of the passive component in the first column of passive components is coupled to a conductive terminal of a ball grid array by way of a first conductive trace in the substrate.

17. The semiconductor package of claim 16, wherein a first terminal of a passive component in the second column of passive components is coupled to a semiconductor die in the second column of semiconductor dies by way of another bond wire, and wherein a second terminal of the passive component in the second column of passive components is coupled to another conductive terminal of the ball grid array by way of a second conductive trace in the substrate.

18. The semiconductor package of claim 8, wherein the first and second columns of passive components include capacitors.

\* \* \* \* \*